(12) United States Patent
Sugimoto et al.

(10) Patent No.: US 11,635,613 B2
(45) Date of Patent: *Apr. 25, 2023

(54) OPTICAL DEVICE

(71) Applicant: HAMAMATSU PHOTONICS K.K., Hamamatsu (JP)

(72) Inventors: Tatsuya Sugimoto, Hamamatsu (JP); Tomofumi Suzuki, Hamamatsu (JP); Kyosuke Kotani, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 520 days.

This patent is subject to a terminal disclaimer.

(21) Appl. No.: 16/625,685

(22) PCT Filed: Jul. 6, 2018

(86) PCT No.: PCT/JP2018/025636
§ 371 (c)(1),
(2) Date: Dec. 21, 2019

(87) PCT Pub. No.: WO2019/009394
PCT Pub. Date: Jan. 10, 2019

(65) Prior Publication Data
US 2021/0132367 A1    May 6, 2021

(30) Foreign Application Priority Data

Jul. 6, 2017 (JP) ............................. JP2017-133093
Dec. 7, 2017 (JP) ............................. JP2017-235022

(51) Int. Cl.
*B81B 3/00* (2006.01)
*G02B 26/08* (2006.01)
*G01J 3/45* (2006.01)

(52) U.S. Cl.
CPC ........ *G02B 26/0841* (2013.01); *B81B 3/0045* (2013.01); *G01J 3/45* (2013.01);
(Continued)

(58) Field of Classification Search
CPC ..................... B81B 2201/042; G02B 26/0841
See application file for complete search history.

(56) References Cited

U.S. PATENT DOCUMENTS 6,507,138 B1   1/2003   Rodgers et al.
7,699,296 B1   4/2010   Knollenberg et al.
(Continued)

FOREIGN PATENT DOCUMENTS

CN    1619351 A    5/2005
CN    1650214 A    8/2005
(Continued)

OTHER PUBLICATIONS

International Preliminary Report on Patentability dated May 28, 2020 for PCT/JP2018/029117.
(Continued)

*Primary Examiner* — Moazzam Hossain
(74) *Attorney, Agent, or Firm* — Faegre Drinker Biddle & Reath LLP

(57) ABSTRACT

An optical device includes an elastic support portion which includes a torsion bar extending in a second direction perpendicular to a first direction and a nonlinearity relaxation spring connected between the torsion bar and a movable portion. The nonlinearity relaxation spring is configured so that a deformation amount of the nonlinearity relaxation spring around the second direction is smaller than a deformation amount of the torsion bar around the second direction and a deformation amount of the nonlinearity relaxation spring in a third direction perpendicular to the first direction and the second direction is larger than a (Continued)

deformation amount of the torsion bar in the third direction while the movable portion moves in the first direction. A first comb finger of a first comb electrode and a second comb finger of a second comb electrode which are adjacent to each other face each other in the second direction.

10 Claims, 14 Drawing Sheets

(52) U.S. Cl.
CPC ... *B81B 2201/033* (2013.01); *B81B 2201/042* (2013.01); *B81B 2203/0136* (2013.01); *B81B 2203/0154* (2013.01); *B81B 2203/04* (2013.01)

(56) References Cited

U.S. PATENT DOCUMENTS

| | | | |
|---|---|---|---|
| 8,353,600 | B1 | 1/2013 | Fu |
| 8,729,770 | B1 | 5/2014 | Milanovic |
| 11,187,872 | B2 | 11/2021 | Sugimoto et al. |
| 2002/0109894 | A1 | 8/2002 | Clark et al. |
| 2004/0004775 | A1 | 1/2004 | Turner et al. |
| 2004/0081391 | A1 | 4/2004 | Ko et al. |
| 2004/0232107 | A1 | 11/2004 | Kouma et al. |
| 2005/0099665 | A1 | 5/2005 | Lee et al. |
| 2005/0194650 | A1 | 9/2005 | Hung |
| 2005/0194840 | A1 | 9/2005 | Mori et al. |
| 2006/0082250 | A1 | 4/2006 | Ko et al. |
| 2008/0123242 | A1 | 5/2008 | Zhou |
| 2008/0198249 | A1 | 8/2008 | Tanimura et al. |
| 2008/0284078 | A1 | 11/2008 | Wolter et al. |
| 2009/0107949 | A1 | 4/2009 | Kouma et al. |
| 2009/0109512 | A1 | 4/2009 | Park |
| 2009/0225387 | A1 | 9/2009 | Mizuno et al. |
| 2010/0208347 | A1 | 8/2010 | Kouma et al. |
| 2011/0080627 | A1 | 4/2011 | He et al. |
| 2011/0090551 | A1 | 4/2011 | Pirk et al. |
| 2011/0109194 | A1 | 5/2011 | Hung et al. |
| 2011/0205608 | A1 | 8/2011 | Mizoguchi |
| 2012/0099176 | A1 | 4/2012 | Zhou |
| 2012/0160557 | A1 | 6/2012 | Yamada et al. |
| 2012/0162739 | A1 | 6/2012 | Yamada |
| 2012/0236382 | A1 | 9/2012 | Puegner et al. |
| 2013/0083379 | A1 | 4/2013 | Tanaka et al. |
| 2013/0321892 | A1 | 12/2013 | Haeberle et al. |
| 2014/0125950 | A1 | 5/2014 | Shimada et al. |
| 2014/0137670 | A1 | 5/2014 | Hata et al. |
| 2014/0300942 | A1* | 10/2014 | Van Lierop .......... G02B 26/105 359/198.1 |
| 2014/0327946 | A1 | 11/2014 | Van Lierop et al. |
| 2014/0355091 | A1 | 12/2014 | Mizutani |
| 2014/0362460 | A1 | 12/2014 | Nozu et al. |
| 2015/0028698 | A1 | 1/2015 | Gutierrez |
| 2015/0234176 | A1 | 8/2015 | Zhou |
| 2016/0216508 | A1 | 7/2016 | Tamamori |
| 2017/0139200 | A1 | 5/2017 | Chang et al. |

FOREIGN PATENT DOCUMENTS

| | | |
|---|---|---|
| CN | 1790181 A | 6/2006 |
| CN | 1837892 A | 9/2006 |
| CN | 101246258 A | 8/2008 |
| CN | 101279708 A | 10/2008 |
| CN | 101284642 A | 10/2008 |
| CN | 101290395 A | 10/2008 |
| CN | 101316789 A | 12/2008 |
| CN | 101410744 A | 4/2009 |
| CN | 101786592 A | 7/2010 |
| CN | 101894711 A | 11/2010 |
| CN | 102177465 A | 9/2011 |
| CN | 102265033 A | 11/2011 |
| CN | 102369153 A | 3/2012 |
| CN | 102667497 A | 9/2012 |
| CN | 102868383 A | 1/2013 |
| CN | 103288034 A | 9/2013 |
| CN | 103803478 A | 5/2014 |
| CN | 203825034 U | 9/2014 |
| CN | 104216109 A | 12/2014 |
| CN | 104272167 A | 1/2015 |
| CN | 104348326 A | 2/2015 |
| CN | 104964678 A | 10/2015 |
| CN | 105453408 A | 3/2016 |
| CN | 105492879 A | 4/2016 |
| CN | 105594114 A | 5/2016 |
| CN | 105826252 A | 8/2016 |
| CN | 105899995 A | 8/2016 |
| CN | 106500682 A | 3/2017 |
| CN | 106597016 A | 4/2017 |
| CN | 106604887 A | 4/2017 |
| CN | 106707415 A | 5/2017 |
| EP | 1677086 A1 | 7/2006 |
| EP | 3015901 A1 | 5/2016 |
| EP | 3070508 A1 | 9/2016 |
| JP | H8-506857 A | 7/1996 |
| JP | 2000-214407 A | 8/2000 |
| JP | 2002-524271 A | 8/2002 |
| JP | 2002-326197 A | 11/2002 |
| JP | 2003-029178 A | 1/2003 |
| JP | 2004-177543 A | 6/2004 |
| JP | 2004-215534 A | 8/2004 |
| JP | 2004-325578 A | 11/2004 |
| JP | 2005-010453 A | 1/2005 |
| JP | 2005-275198 A | 10/2005 |
| JP | 2006-343481 A | 12/2006 |
| JP | 2007-155965 A | 6/2007 |
| JP | 2007-183400 A | 7/2007 |
| JP | 2007-188073 A | 7/2007 |
| JP | 2008-055516 A | 3/2008 |
| JP | 2008-083122 A | 4/2008 |
| JP | 2009-171394 A | 7/2009 |
| JP | 2010-008611 A | 1/2010 |
| JP | 2010-029976 A | 2/2010 |
| JP | 2010-054944 A | 3/2010 |
| JP | 2010-085506 A | 4/2010 |
| JP | 2010-128116 A | 6/2010 |
| JP | 2010-184334 A | 8/2010 |
| JP | 2011-069954 A | 4/2011 |
| JP | 2011-175044 A | 9/2011 |
| JP | 2012-042666 A | 3/2012 |
| JP | 2012-133242 A | 7/2012 |
| JP | 2012-184962 A | 9/2012 |
| JP | 2012-524295 A | 10/2012 |
| JP | 2012-528343 A | 11/2012 |
| JP | 2013-009447 A | 1/2013 |
| JP | 2013-016651 A | 1/2013 |
| JP | 2013-148707 A | 8/2013 |
| JP | 2014-006418 A | 1/2014 |
| JP | 2014-023207 A | 2/2014 |
| JP | 2014-035429 A | 2/2014 |
| JP | 2014-115267 A | 6/2014 |
| JP | 2014-215534 A | 11/2014 |
| JP | 2014-235260 A | 12/2014 |
| JP | 2014-238581 A | 12/2014 |
| JP | 2015-093340 A | 5/2015 |
| JP | 2015-102483 A | 6/2015 |
| JP | 2015-219516 A | 12/2015 |
| JP | 2016-085299 A | 5/2016 |
| JP | 2016-114798 A | 6/2016 |
| JP | 2016-151681 A | 8/2016 |
| JP | 2016-200834 A | 12/2016 |
| JP | 2016-212221 A | 12/2016 |
| JP | 2017-058418 A | 3/2017 |
| JP | 2017-070163 A | 4/2017 |
| JP | 2017-129783 A | 7/2017 |
| TW | 201531709 A | 8/2015 |
| TW | I563290 B | 12/2016 |
| TW | 201717371 A | 5/2017 |
| TW | 201718896 A | 6/2017 |
| TW | I588533 B | 6/2017 |
| WO | WO 94/018697 A1 | 8/1994 |
| WO | WO-00/013210 A2 | 3/2000 |
| WO | WO 2009/124607 A1 | 10/2009 |

(56) References Cited

FOREIGN PATENT DOCUMENTS

| WO | WO-2010/121185 A1 | 10/2010 |
|---|---|---|
| WO | WO-2010/136358 A2 | 12/2010 |
| WO | WO 2011/091012 A2 | 7/2011 |
| WO | WO-2013/046612 A1 | 4/2013 |
| WO | WO 2015/068400 A1 | 5/2015 |
| WO | WO 2016/002453 A1 | 1/2016 |

OTHER PUBLICATIONS

Sandner, Thilo et al., "Out-of-plane translatory MEMS actuator with extraordinary large stroke for optical path length modulation in miniaturized FTIR Spectrometers," Sensor+Test Conferences 2011, Proceedings IRS2, Jun. 9, 2011, p. 151-p. 156.
International Preliminary Report on Patentability dated Jan. 16, 2020 for PCT/JP2018/025636.
International Preliminary Report on Patentability dated Jan. 16, 2020 for PCT/JP2018/025634.
International Preliminary Report on Patentability dated Jan. 16, 2020 for PCT/JP2018/025638.
International Preliminary Report on Patentability dated Jan. 16, 2020 for PCT/JP2018/025639.
International Preliminary Report on Patentability dated Jan. 16, 2020 for PCT/JP2018/025635.
International Preliminary Report on Patentability dated Jan. 16, 2020 for PCT/JP2018/025637.
International Preliminary Report on Patentability dated Jan. 16, 2020 for PCT/JP2018/025640.
Akin Aydemir et al., "A new design and a fabrication approach to realize a high performance three axes capacitive MEMS accelerometer", Sensors and Actuators A Physical, vol. 244, Jun. 15, 2016, p. 324-p. 333.
Sun Fengming et al., "MEMS Based Micro Displacement Sensor and Its Application", Chinese Journal of Sensors and Actuators, vol. 26, No. 2, Feb. 2013, p. 293-p. 296.
Sandner Thilo et al., "Translatory MEMS actuator and their system integration for miniaturized Fourier transform spectrometers", Moems and Miniaturized Systems XI, SPIE, 1000 20th St. Bellingham WA 98225-6705 USA, vol. 8252, No. 1, Mar. 8, 2012, p. 1-p. 10, XP060023646.
English-language translation of International Preliminary Report on Patentability (IPRP) dated May 28, 2020 that issued in WO Patent Application No. PCT/JP2018/032760.
Anonymous, "Michelson Interferometer—Definition and Applications", URL:https://www.azooptics.com/Article.aspx?ArticleID=698, May 6, 2014, XP093017159.

\* cited by examiner

Fig.6
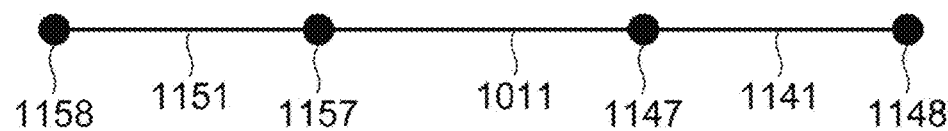
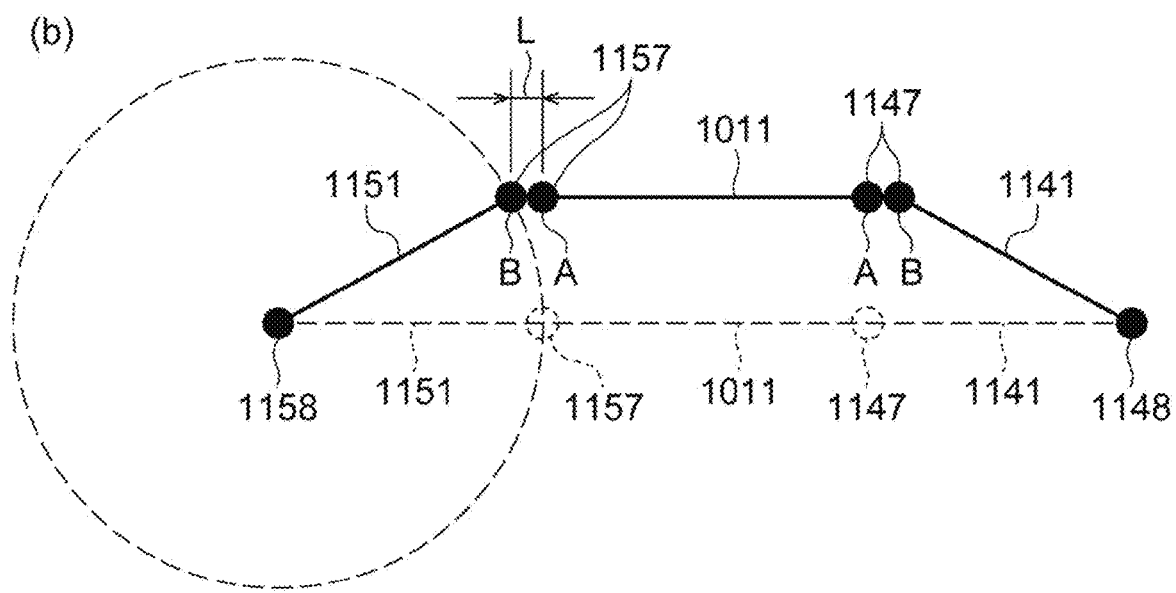

*Fig.7*
(a)
(b)
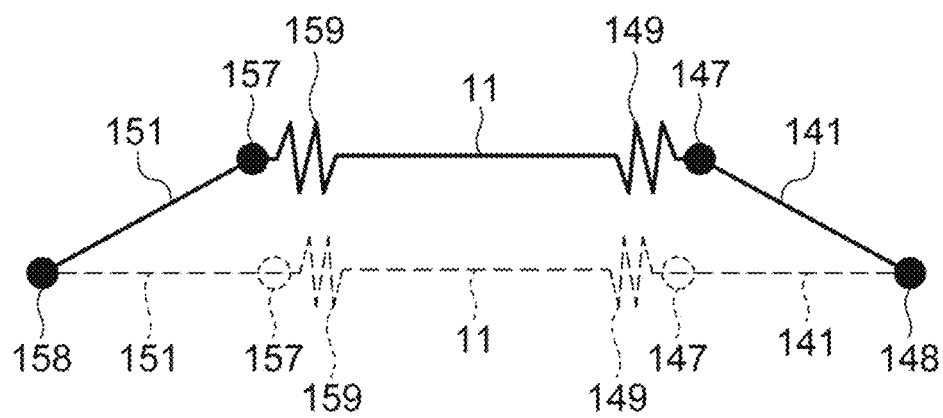

OPTICAL DEVICE

TECHNICAL FIELD

The present disclosure relates to an optical device configured as, for example, a micro electro mechanical systems (MEMS) device.

BACKGROUND ART

As an MEMS device, an optical device including a base; a movable portion which includes an optical function unit; an elastic support portion which is connected between the base and the movable portion and supports the movable portion so that the movable portion is movable along a movement direction; a first comb electrode which is provided in the base and includes a plurality of first comb fingers; and a second comb electrode which is provided in the elastic support portion and includes a plurality of second comb fingers alternately arranged with the plurality of first comb fingers is known (for example, see Patent Literature 1). In such an optical device, there is a case in which the elastic support portion includes a torsion bar which is twisted and deformed when the movable portion moves along the movement direction.

CITATION LIST

Non Patent Literature

Non Patent Literature 1: Thilo Sandner, Thomas Grasshoff, Harald Schenk, and Andreas Kenda, "Out-of-plane translator MEMS actuator with extraordinary large stroke for optical path length modulation in miniaturized FTIR Spectrometers", SENSOR+TEST Conferences 2011, ProceedingsIRS2, pp. 151-156

SUMMARY OF INVENTION

Technical Problem

In the optical device as described above, the torsion bar is bent and deformed in a direction perpendicular to an extension direction when the movable portion moves in the movement direction depending on the configuration of the elastic support portion. In this case, nonlinearity occurs in the torsional deformation of the torsion bar because the torsion bar is twisted in a bent state. Because there is concern that such nonlinearity may deteriorate the control characteristic of the movable portion, the occurrence of nonlinearity needs to be suppressed. Further, in the optical device as described above, improved reliability is required.

An object of an aspect of the present disclosure is to provide an optical device capable of obtaining high reliability while suppressing the occurrence of nonlinearity in torsional deformation of a torsion bar.

Solution to Problem

An optical device according to an aspect of the present disclosure includes: a base; a movable portion which includes an optical function unit; an elastic support portion which is connected between the base and the movable portion and supports the movable portion so that the movable portion is movable along a first direction; a first comb electrode which is provided to the base and includes a plurality of first comb fingers; and a second comb electrode which is provided to at least one of the movable portion and the elastic support portion and includes a plurality of second comb fingers alternately arranged with the plurality of first comb fingers, in which the elastic support portion includes a torsion bar extending along a second direction perpendicular to the first direction and a nonlinearity relaxation spring connected between the torsion bar and the movable portion, in which the nonlinearity relaxation spring is configured so that a deformation amount of the nonlinearity relaxation spring around the second direction is smaller than a deformation amount of the torsion bar around the second direction and a deformation amount of the nonlinearity relaxation spring in a third direction perpendicular to the first direction and the second direction is larger than a deformation amount of the torsion bar in the third direction while the movable portion moves in the first direction, and in which the first comb finger and the second comb finger which are adjacent to each other face each other in the second direction.

In this optical device, the elastic support portion includes the nonlinearity relaxation spring connected between the torsion bar and the movable portion. The nonlinearity relaxation spring is configured so that the deformation amount of the nonlinearity relaxation spring around the second direction is smaller than the deformation amount of the torsion bar around the second direction and the deformation amount of the nonlinearity relaxation spring in the third direction is larger than the deformation amount of the torsion bar in the third direction while the movable portion moves in the first direction. Accordingly, because the nonlinearity relaxation spring is deformed so as to be larger than the torsion bar in the third direction while being deformed so as to be smaller than the torsion bar around the second direction when the movable portion moves in the first direction, it is possible to suppress the bending deformation of the torsion bar in the third direction. As a result, it is possible to suppress the occurrence of nonlinearity in torsional deformation of the torsion bar. On the other hand, in case the nonlinearity relaxation spring is provided, the movement amount of the second comb electrode in the third direction tends to easily increase when an external force is exerted. In this respect, in this optical device, because the first comb finger and the second comb finger which are adjacent to each other face each other in the second direction, the first comb finger and the second comb finger are hard to approach each other even when the second comb electrode moves in the third direction. For that reason, it is possible to suppress the breakage due to the contact between the comb fingers or deterioration in the control characteristic of the movable portion as the comb fingers approach each other. As a result, high reliability can be obtained. Thus, according to this optical device, it is possible to obtain high reliability while suppressing the occurrence of nonlinearity in torsional deformation of the torsion bar.

In the optical device according to an aspect of the present disclosure, the nonlinearity relaxation spring may include a plate-shaped portion and the length of the plate-shaped portion in the second direction may be longer than the length of the torsion bar.

Accordingly, it is possible to effectively suppress the occurrence of nonlinearity in torsional deformation of the torsion bar.

In the optical device according to an aspect of the present disclosure, the nonlinearity relaxation spring may include a pair of plate-shaped portions and the pair of plate-shaped portions may face each other in the third direction. Accordingly, it is possible to effectively suppress the occurrence of nonlinearity in torsional deformation of the torsion bar.

In the optical device according to an aspect of the present disclosure, the elastic support portion may further include a lever connected to the nonlinearity relaxation spring through the torsion bar at one end portion and an electrode support member extending between the lever and the movable portion when viewed from the first direction and the second comb electrode may be provided to the electrode support member. Accordingly, it is possible to secure the arrangement area of the second comb electrode and to secure the magnitude of the electrostatic force generated by the first and second comb electrodes.

In the optical device according to an aspect of the present disclosure, the elastic support portion may further include a lever connected to the nonlinearity relaxation spring through the torsion bar at one end portion and the second comb electrode may be provided to the lever. Accordingly, it is possible to secure the arrangement area of the second comb electrode and to secure the magnitude of the electrostatic force generated by the first and second comb electrodes.

In the optical device according to an aspect of the present disclosure, the elastic support portion may include a pair of the levers and further include a link bridges the pair of levers and the second comb electrode may be disposed across the pair of levers and the link. Accordingly, it is possible to effectively secure the arrangement area of the second comb electrode and to appropriately secure the magnitude of the electrostatic force generated by the first and second comb electrodes.

In the optical device of the present disclosure, the elastic support portion may further include a torsion bar connected between the other end portion of the lever and the base. Accordingly, the movement amount of the movable portion can be increased.

In the optical device according to an aspect of the present disclosure, the elastic support portion may further include a lever connected to the nonlinearity relaxation spring through the torsion bar at one end portion and a torsion bar connected between the other end portion of the lever and the base. Accordingly, the movement amount of the movable portion can be increased.

In the optical device according to an aspect of the present disclosure, the elastic support portion may include a lever connected to the nonlinearity relaxation spring through the torsion bar at one end portion and an electrode support member extending from the lever and the second comb electrode may be provided to the electrode support member. Accordingly, it is possible to secure the electrostatic force generated between the first comb electrode and the second comb electrode even when the movement amount of the movable mirror in the first direction is increased.

In the optical device of the present disclosure, the nonlinearity relaxation spring may include a meandering portion which extends in a meandering manner when viewed from the first direction. Accordingly, it is possible to effectively suppress the occurrence of nonlinearity in torsional deformation of the torsion bar.

Advantageous Effects of Invention

According to an aspect of the present disclosure, it is possible to provide an optical device capable of obtaining high reliability while suppressing the occurrence of nonlinearity in torsional deformation of a torsion bar.

BRIEF DESCRIPTION OF DRAWINGS

FIGS. 6($a$) and 6($b$) are diagrams for describing an function and an effect of the optical device illustrated in FIG. 3.

FIGS. 7($a$) and 7($b$) are diagrams for describing an function and an effect of the optical device illustrated in FIG. 3.

DESCRIPTION OF EMBODIMENTS

Figure 1:
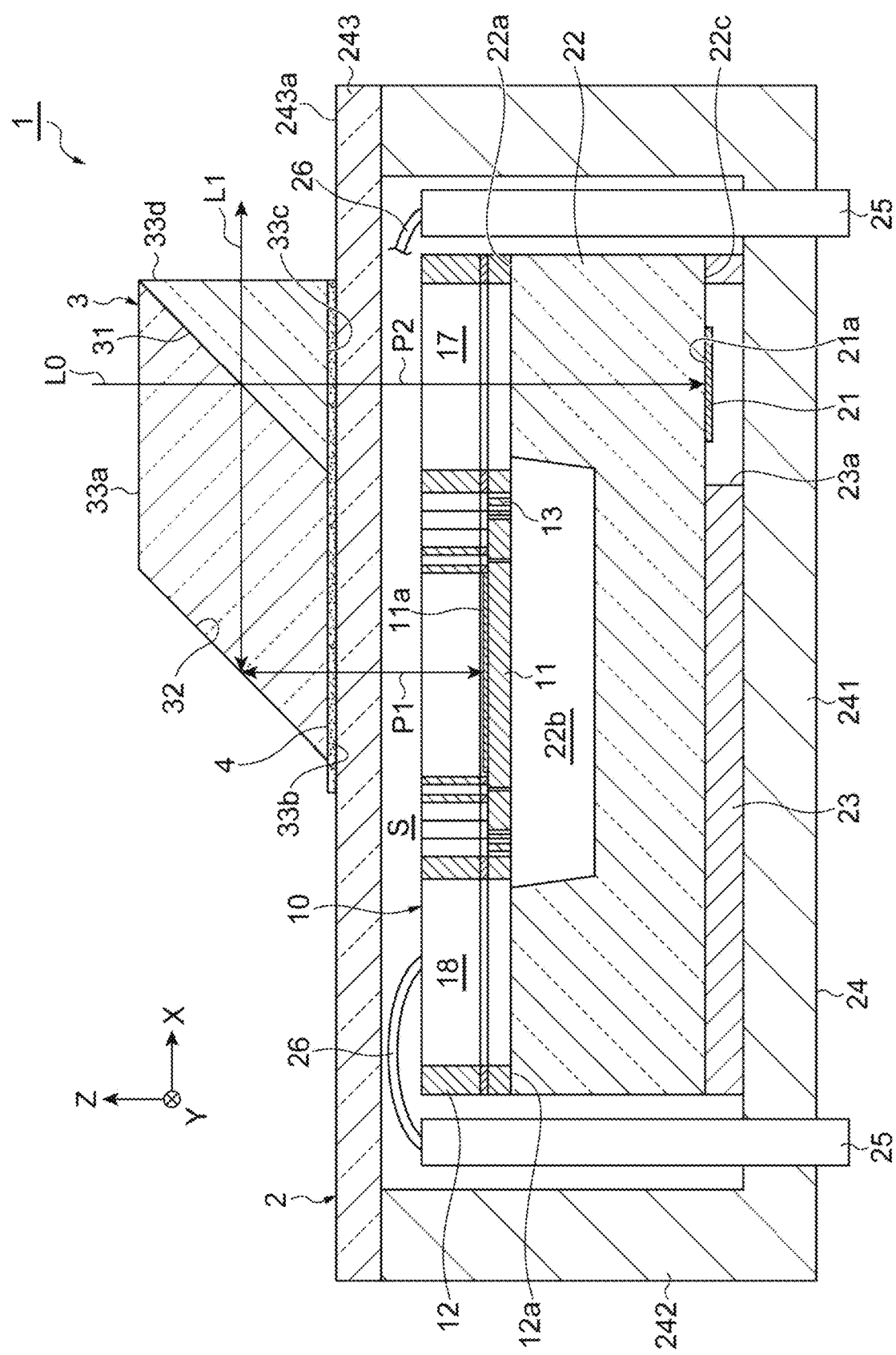
FIG. 1 is a longitudinal sectional view of an optical module with an optical device of an embodiment.

Hereinafter, an embodiment according to an aspect of the present disclosure will be described in detail with reference to the drawings. Furthermore, in the drawings, the same or corresponding components will be denoted by the same reference numerals and a redundant part will be omitted.

[Configuration of Optical Module]

As illustrated in FIG. 1, an optical module 1 includes a mirror unit 2 and a beam splitter unit 3. The mirror unit 2 includes an optical device 10 and a fixed mirror 21. The optical device 10 includes a movable mirror (a movable portion) 11. In the optical module 1, the beam splitter unit 3, the movable mirror 11, and the fixed mirror 21 constitute an interference optical system for measurement light L0. Here, the interference optical system is a Michelson interference optical system.

The optical device 10 includes a base 12, a drive unit 13, a first optical function unit 17, and a second optical function unit 18 in addition to the movable mirror 11. The base 12 includes a main surface 12$a$. The movable mirror 11 includes a mirror surface (an optical function unit) 11$a$ following a plane parallel to the main surface 12$a$. The movable mirror 11 is supported by the base 12 so as to be movable along a Z-axis direction perpendicular to the main surface 12$a$ (a direction parallel to the Z axis, a first direction). The drive unit 13 moves the movable mirror 11 along the Z-axis direction. The first optical function unit 17 is disposed at one side of the movable mirror 11 in an X-axis direction perpendicular to the Z-axis direction (a direction parallel to the X axis, a third direction) when viewed from the Z-axis direction. The second optical function unit 18 is disposed at the other side of the movable mirror 11 in the X-axis direction when viewed from the Z-axis direction. The first optical function unit 17 and the second optical function unit 18 are respectively light passage opening portions provided in the base 12 and are opened to one side and the other side in the Z-axis direction. Furthermore, in the optical module 1, the second optical function unit 18 is not used as the light passage opening portion. When the optical device 10 is applied to other apparatuses, there is a case in which at least one of the first optical function unit 17 and the second optical function unit 18 is used as the optical function unit or both of the first optical function unit 17 and the second optical function unit 18 are not used as the optical function unit.

The fixed mirror 21 includes a mirror surface 21a following a plane parallel to the main surface 12a (a plane perpendicular to the Z-axis direction). The position of the fixed mirror 21 with respect to the base 12 is fixed. In the mirror unit 2, the mirror surface 11a of the movable mirror 11 and the mirror surface 21a of the fixed mirror 21 face one side in the Z-axis direction (the side of the beam splitter unit 3).

The mirror unit 2 includes a support body 22, a sub-mount 23, and a package 24 in addition to the optical device 10 and the fixed mirror 21. The package 24 accommodates the optical device 10, the fixed mirror 21, the support body 22, and the sub-mount 23. The package 24 includes a bottom wall 241, a side wall 242, and a ceiling wall 243. The package 24 is formed in, for example, a rectangular parallelepiped box shape. The package 24 has, for example, a size of about 30×25×10 (thickness) mm. The bottom wall 241 and the side wall 242 are integrally formed with each other. The ceiling wall 243 faces the bottom wall 241 in the Z-axis direction and is fixed to the side wall 242. The ceiling wall 243 has optical transparency with respect to the measurement light L0. In the mirror unit 2, a space S is formed by the package 24. The space S is opened to the outside of the mirror unit 2 through, for example, a ventilation hole, a gap, or the like provided in the package 24. In this way, when the space S is not an airtight space, contamination, clouding, or the like of the mirror surface 11a caused by an out gas from the resin material present in the package 24, moisture present in the package 24, or the like can be suppressed. Additionally, the space S may be an airtight space in which a high degree of vacuum is maintained or an airtight space filled with an inert gas such as nitrogen.

The support body 22 is fixed to the inner surface of the bottom wall 241 through the sub-mount 23. The support body 22 is formed in, for example, a rectangular plate shape. The support body 22 has optical transparency with respect to the measurement light L0. The base 12 of the optical device 10 is fixed to a surface 22a at the side opposite to the sub-mount 23 in the support body 22. That is, the base 12 is supported by the support body 22. A concave portion 22b is formed on the surface 22a of the support body 22 and a gap (a part of the space S) is formed between the optical device 10 and the ceiling wall 243. Accordingly, the contact of the movable mirror 11 and the drive unit 13 with respect to the support body 22 and the ceiling wall 243 is prevented when the movable mirror 11 is moved along the Z-axis direction.

An opening 23a is formed in the sub-mount 23. The fixed mirror 21 is disposed on a surface 22c at the side of the sub-mount 23 in the support body 22 so as to be located within the opening 23a. That is, the fixed mirror 21 is disposed on the surface 22c at the side opposite to the base 12 in the support body 22. The fixed mirror 21 is disposed at one side of the movable mirror 11 in the X-axis direction when viewed from the Z-axis direction. The fixed mirror 21 overlaps the first optical function unit 17 of the optical device 10 when viewed from the Z-axis direction.

The mirror unit 2 further includes a plurality of lead pins 25 and a plurality of wires 26. Each lead pin 25 is fixed to the bottom wall 241 while penetrating the bottom wall 241. Each lead pin 25 is electrically connected to the drive unit 13 through a wire 26. In the mirror unit 2, an electric signal for moving the movable mirror 11 along the Z-axis direction is applied to the drive unit 13 through the plurality of lead pins 25 and the plurality of wires 26.

The beam splitter unit 3 is supported by the ceiling wall 243 of the package 24. Specifically, the beam splitter unit 3 is fixed to a surface 243a at the side opposite to the optical device 10 in the ceiling wall 243 by an optical resin 4. The optical resin 4 has optical transparency with respect to the measurement light L0.

The beam splitter unit 3 includes a half mirror surface 31, a total reflection mirror surface 32, and a plurality of optical surface 33a, 33b, 33c, and 33d. The beam splitter unit 3 is configured by bonding a plurality of optical blocks. The half mirror surface 31 is formed by, for example, a dielectric multilayer. The total reflection mirror surface 32 is formed by, for example, a metal film.

The optical surface 33a is, for example, a surface perpendicular to the Z-axis direction and overlaps the first optical function unit 17 of the optical device 10 and the mirror surface 21a of the fixed mirror 21 when viewed from the Z-axis direction. The measurement light L0 which is incident along the Z-axis direction is transmitted through the optical surface 33a.

The half mirror surface 31 is, for example, a surface inclined by 45° with respect to the optical surface 33a and overlaps the first optical function unit 17 of the optical device 10 and the mirror surface 21a of the fixed mirror 21 when viewed from the Z-axis direction. The half mirror surface 31 reflects a part of the measurement light L0, which is incident to the optical surface 33a along the Z-axis direction, along the X-axis direction and transmits the remaining part of the measurement light L0 toward the fixed mirror 21 along the Z-axis direction.

The total reflection mirror surface 32 is a surface parallel to the half mirror surface 31, overlaps the mirror surface 11a of the movable mirror 11 when viewed from the Z-axis direction, and overlaps the half mirror surface 31 when viewed from the X-axis direction. The total reflection mirror surface 32 reflects a part of the measurement light L0 reflected by the half mirror surface 31 toward the movable mirror 11 along the Z-axis direction.

The optical surface 33b is a surface parallel to the optical surface 33a and overlaps the mirror surface 11a of the movable mirror 11 when viewed from the Z-axis direction. The optical surface 33b transmits a part of the measurement light L0 reflected by the total reflection mirror surface 32 toward the movable mirror 11 along the Z-axis direction.

The optical surface 33c is a surface parallel to the optical surface 33a and overlaps the mirror surface 21a of the fixed mirror 21 when viewed from the Z-axis direction. The optical surface 33c transmits the remaining part of the measurement light L0 transmitted through the half mirror surface 31 toward the fixed mirror 21 along the Z-axis direction.

The optical surface 33d is, for example, a surface perpendicular to the X-axis direction and overlaps the half mirror surface 31 and the total reflection mirror surface 32 when viewed from the X-axis direction. The optical surface 33d transmits the measurement light L1 along the X-axis direction. The measurement light L1 is the interference light of a part of the measurement light L0 sequentially reflected by the mirror surface 11a of the movable mirror 11 and the total reflection mirror surface 32 and transmitted through the half mirror surface 31 and the remaining part of the measurement light L0 sequentially reflected by the mirror surface 21a of the fixed mirror 21 and the half mirror surface 31.

In the optical module 1 with the above-described configuration, when the measurement light L0 is incident from the outside of the optical module 1 to the beam splitter unit 3 through the optical surface 33a, a part of the measurement light L0 is sequentially reflected by the half mirror surface 31 and the total reflection mirror surface 32 and travels toward the mirror surface 11a of the movable mirror 11. Then, a part of the measurement light L0 is reflected by the mirror surface 11a of the movable mirror 11, travels in the reverse direction on the same optical path (an optical path P1 to be described later), and is transmitted through the half mirror surface 31 of the beam splitter unit 3.

Meanwhile, the remaining part of the measurement light L0 is transmitted through the half mirror surface 31 of the beam splitter unit 3, passes through the first optical function unit 17, is further transmitted through the support body 22, and travels toward the mirror surface 21a of the fixed mirror 21. Then, the remaining part of the measurement light L0 is reflected by the mirror surface 21a of the fixed mirror 21, travels in the reverse direction on the same optical path (an optical path P2 to be described later), and is reflected by the half mirror surface 31 of the beam splitter unit 3.

A part of the measurement light L0 transmitted through the half mirror surface 31 of the beam splitter unit 3 and the remaining part of the measurement light L0 reflected by the half mirror surface 31 of the beam splitter unit 3 become the measurement light L1 that is the interference light and the measurement light L1 is emitted from the beam splitter unit 3 to the outside of the optical module 1 through the optical surface 33d. According to the optical module 1, because it is possible to reciprocate the movable mirror 11 at a high speed along the Z-axis direction, a small and highly accurate Fourier transform infrared spectrometer (FTIR) can be provided.

The support body 22 corrects an optical path difference between an optical path P1 between the beam splitter unit 3 and the movable mirror 11 and an optical path P2 between the beam splitter unit 3 and the fixed mirror 21. Specifically, the optical path P1 is an optical path extending from the half mirror surface 31 to the mirror surface 11a of the movable mirror 11 located at the reference position through the total reflection mirror surface 32 and the optical surface 33b in a sequential order and is an optical path along which a part of the measurement light L0 travels. The optical path P2 is an optical path extending from the half mirror surface 31 to the mirror surface 21a of the fixed mirror 21 through the optical surface 33c and the first optical function unit 17 in a sequential order and is an optical path along which the remaining part of the measurement light L0 travels. The support body 22 corrects the optical path difference between the optical path P1 and the optical path P2 so that a difference between the optical path length of the optical path P1 (the optical path length considering the refractive index of each medium through which the optical path P1 passes) and the optical path length of the optical path P2 (the optical path length considering the refractive index of each medium through which the optical path P2 passes) decreases (for example, becomes zero). Furthermore, the support body 22 can be formed of, for example, a material having the same optical transparency as that of each of the optical blocks constituting the beam splitter unit 3. In this case, the thickness (the length in the Z-axis direction) of the support body 22 can be the same as the distance between the half mirror surface 31 and the total reflection mirror surface 32 in the X-axis direction.

[Configuration of Optical Device]

Figure 2:
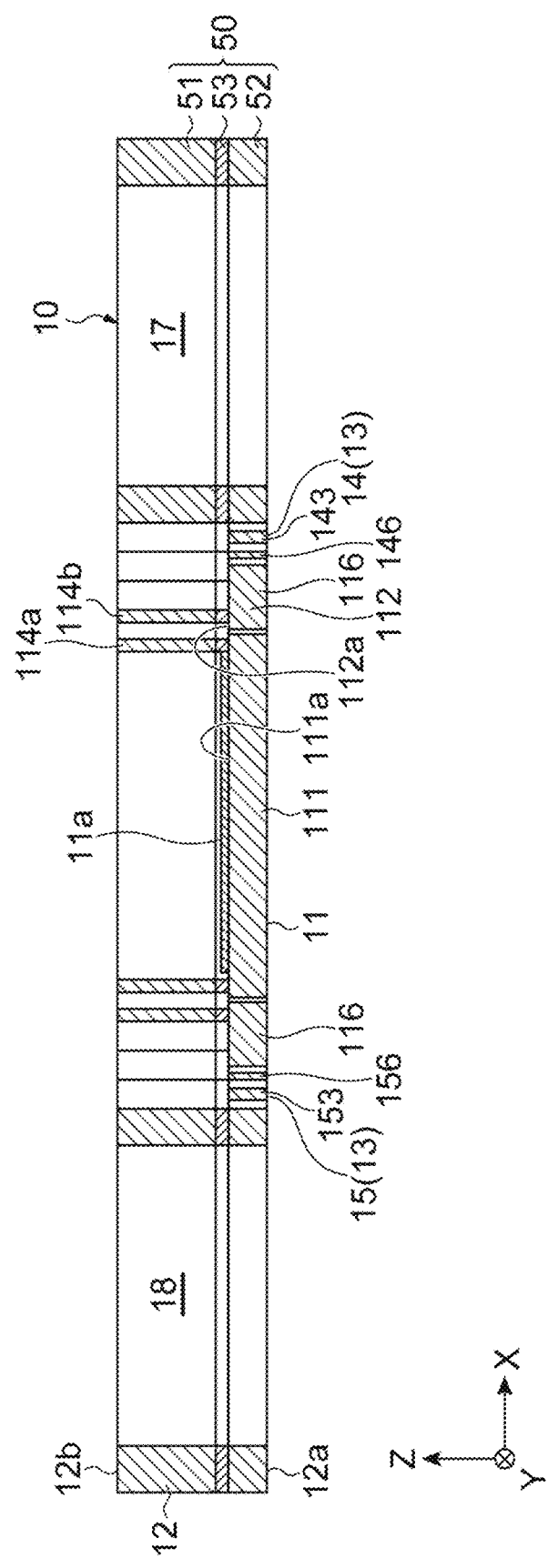
FIG. 2 is a longitudinal sectional view of the optical device illustrated in FIG. 1.
Figure 3:
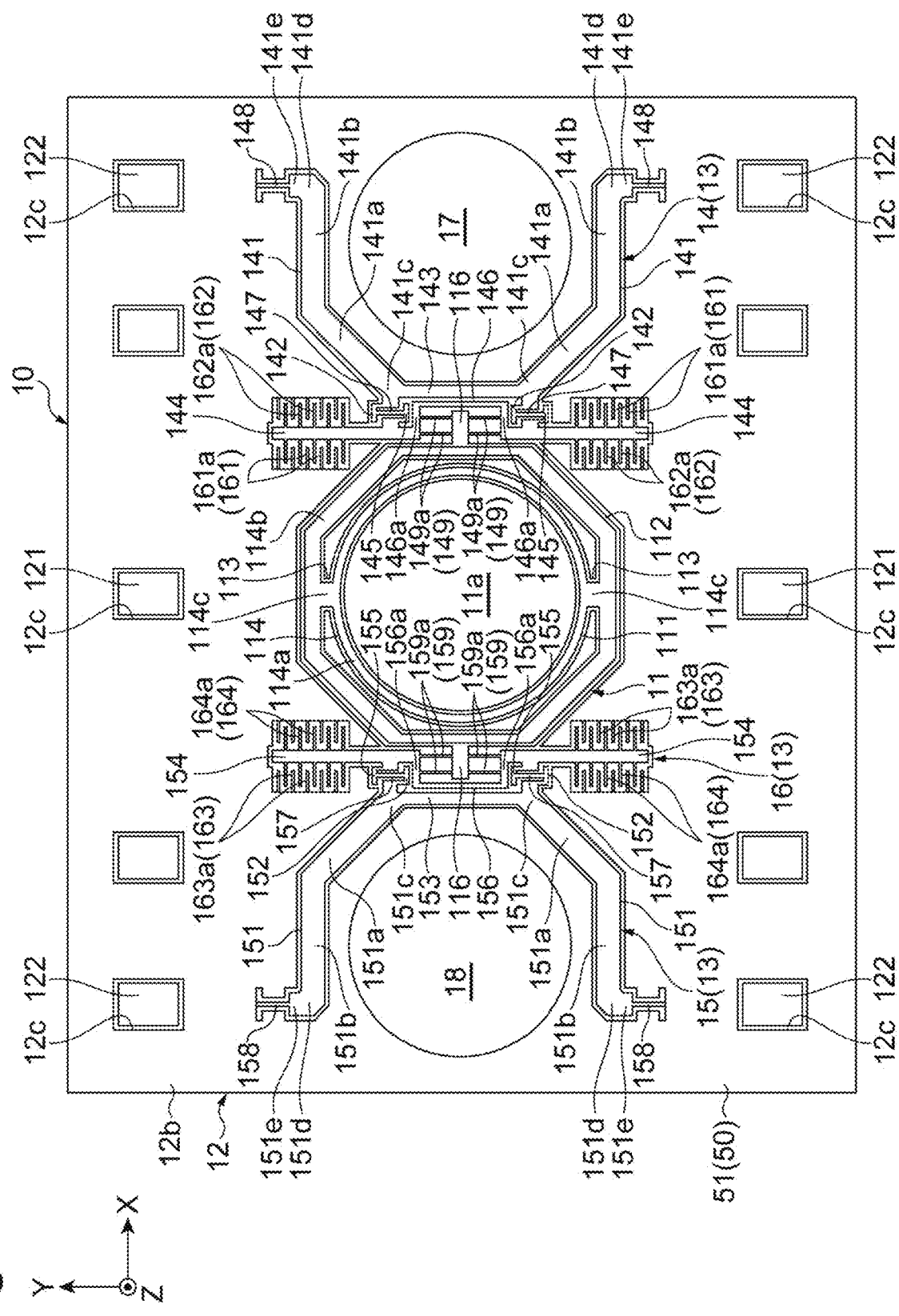
FIG. 3 is a plan view of the optical device illustrated in FIG. 2.

As illustrated in FIGS. 2 and 3, a portion other than the mirror surface 11a of the movable mirror 11, the base 12, the drive unit 13, the first optical function unit 17, and the second optical function unit 18 are configured by a silicon on insulator (SOI) substrate 50. That is, the optical device 10 is formed by the SOI substrate 50. The optical device 10 is formed in, for example, a rectangular plate shape. The optical device 10 has, for example, a size of about 15×10× 0.3 (thickness) mm. The SOI substrate 50 includes a support layer 51, a device layer 52, and an intermediate layer 53. Specifically, the support layer 51 is a first silicon layer of the SOI substrate 50. The device layer 52 is a second silicon layer of the SOI substrate 50. The intermediate layer 53 is an insulation layer of the SOI substrate 50 and is disposed between the support layer 51 and the device layer 52. The movable mirror 11 and the drive unit 13 are integrally formed in a part of the device layer 52 by an MEMS technology (patterning and etching).

The base 12 is formed by the support layer 51, the device layer 52, and the intermediate layer 53. The main surface 12a of the base 12 is a surface at the side opposite to the intermediate layer 53 in the device layer 52. A main surface 12b opposing to the main surface 12a in the base 12 is a surface at the side opposite to the intermediate layer 53 in the support layer 51. In the optical module 1, the main surface 12a of the base 12 is bonded to the surface 22a of the support body 22 (see FIG. 1).

The movable mirror 11 includes a main body 111, an annular portion 112, a pair of connection portions 113, and a wall portion 114. The main body 111, the annular portion 112, and the pair of connection portions 113 are formed by the device layer 52. The main body 111 has a circular shape when viewed from the Z-axis direction, but may have any shape such as an octagonal shape. A metal film is formed on a surface 111a at the side of the main surface 12b in the main body 111 so that the mirror surface 11a is provided. The annular portion 112 extends along the outer edge of the main body 111 and is formed in an annular shape so as to surround the main body 111 when viewed from the Z-axis direction. The inner edge and the outer edge of the annular portion 112 are formed in an octagonal shape when viewed from the Z-axis direction, but may be formed in any shape such as a circular shape. The pair of connection portions 113 are respectively disposed at one side and the other side of the Y-axis direction perpendicular to the Z-axis direction and the X-axis direction (a direction parallel to the Y axis, a second direction) with respect to the main body 111. Each connection portion 113 connects the main body 111 and the annular portion 112 to each other.

The wall portion 114 is formed by the support layer 51 and the intermediate layer 53. The wall portion 114 includes an inner wall portion 114a, an outer wall portion 114b, and a pair of connection portions 114c. The inner wall portion 114a is provided in the surface 111a of the main body 111. The inner wall portion 114a surrounds the mirror surface 11a when viewed from the Z-axis direction. As an example, the inner wall portion 114a is provided in the surface 111a of the main body 111 so as to follow the outer edge at the inside of the outer edge of the main body 111 when viewed from the Z-axis direction and to follow the outer edge at the outside of the outer edge of the mirror surface 11a when viewed from the Z-axis direction.

The outer wall portion 114b is provided in a surface 112a at the side of the main surface 12b in the annular portion 112. As an example, the outer wall portion 114b is provided in the surface 112a of the annular portion 112 so as to follow the outer edge at the inside of the outer edge of the annular portion 112 when viewed from the Z-axis direction and to follow the inner edge at the outside of the inner edge of the annular portion 112 when viewed from the Z-axis direction. The pair of connection portions 114c are respectively provided in a surface at the side of the main surface 12b in the pair of connection portions 113. Each connection portion 114c connects the inner wall portion 114a and the outer wall portion 114b to each other.

The movable mirror 11 further includes a pair of brackets 116. Each bracket 116 is formed by the device layer 52. Each bracket 116 has a rectangular shape when viewed from the Z-axis direction. One bracket 116 is provided in a surface at the side of the first optical function unit 17 in the annular portion 112 so as to protrude toward the first optical function unit 17. The other bracket 116 is provided in a surface at the side of the second optical function unit 18 in the annular portion 112 so as to protrude toward the second optical function unit 18 (the side opposite to the first optical function unit 17).

The drive unit 13 includes a first elastic support portion 14, a second elastic support portion 15, and an actuator 16. The first elastic support portion 14, the second elastic support portion 15, and the actuator 16 are formed by the device layer 52.

Each of the first elastic support portion 14 and the second elastic support portion 15 is connected between the base 12 and the movable mirror 11. The first elastic support portion 14 and the second elastic support portion 15 support the movable mirror 11 so that the movable mirror 11 is movable along the Z-axis direction.

The first elastic support portion 14 includes a pair of levers 141, a pair of brackets 142, a link 143, a pair of electrode support members 144, a pair of brackets 145, a link 146, a pair of first torsion bars 147, a pair of second torsion bars 148, and a pair of nonlinearity relaxation springs 149. The pair of levers 141 extend along a plane perpendicular to the Z-axis direction from the movable mirror 11 toward both sides of the first optical function unit 17 in the Y-axis direction. In this embodiment, the pair of levers 141 extend along the main surface 12a of the base 12 from a gap between the movable mirror 11 and the first optical function unit 17 toward both sides of the first optical function unit 17 in the Y-axis direction.

Each lever 141 includes a first portion 141a which is disposed at the side of the movable mirror 11 and a second portion 141b which is disposed at the side opposite to the movable mirror 11 with respect to the first portion 141a. In the pair of levers 141, the first portions 141a extend obliquely so as to be separated from each other as it goes away from the movable mirror 11. Each second portion 141b extends along the X-axis direction.

The pair of brackets 142 are provided in a surface at the side of the movable mirror 11 in the first portion 141a so as to protrude toward the movable mirror 11. Each bracket 142 is bent in a crank shape to the same side when viewed from the Z-axis direction. The link 143 is laid between end portions 141c at the side of the movable mirror 11 in the levers 141. The link 143 extends along the Y-axis direction.

Each electrode support member 144 has a rectangular shape when viewed from the Z-axis direction. One electrode support member 144 extends between one lever 141 and the movable mirror 11 and protrudes outward in relation to the movable mirror 11 in the Y-axis direction. The other electrode support member 144 extends between the other lever 141 and the movable mirror 11 and protrudes outward in relation to the movable mirror 11 in the Y-axis direction. The pair of electrode support members 144 are disposed on the same center line parallel to the Y-axis direction when viewed from the Z-axis direction.

The pair of brackets 145 are provided in a surface at the side of the first optical function unit 17 in the electrode support member 144 so as to protrude toward the first optical function unit 17. Each bracket 145 is bent in a crank shape to the same side (here, the side opposite to each bracket 142) when viewed from the Z-axis direction. The front end portion of one bracket 145 faces the front end portion of one bracket 142 in the Y-axis direction. The front end portion of the other bracket 145 faces the front end portion of the other bracket 142 in the Y-axis direction.

The link 146 is laid between the inner end portions of the electrode support members 144. The link 146 is formed in a substantially U-shape which is opened toward the movable mirror 11 when viewed from the Z-axis direction. The link 146 faces one bracket 116 of the movable mirror 11 in the Y-axis direction. More specifically, the link 146 includes a pair of side portions 146a extending in the X-axis direction and facing each other in the Y-axis direction and one bracket 116 is disposed between the pair of side portions 146a.

The first torsion bar 147 is laid between the front end portion of one bracket 142 and the front end portion of one bracket 145 and between the front end portion of the other bracket 142 and the front end portion of the other bracket 145. The first torsion bar 147 is laid between the bracket 142 and the bracket 145 which are bent in a crank shape to the opposite side. That is, the end portion 141c of each lever 141 is connected to the electrode support member 144 through the first torsion bar 147. The pair of first torsion bars 147 are disposed on the same axis parallel to the Y-axis direction.

The second torsion bar 148 is laid between the base 12 and the end portion 141d at the side opposite to the movable mirror 11 in one lever 141 and between the base 12 and the end portion 141d at the side opposite to the movable mirror 11 in the other lever 141. That is, the end portion 141d of each lever 141 is connected to the base 12 through the second torsion bar 148. The pair of second torsion bars 148 are disposed on the same axis parallel to the Y-axis direction. The end portion 141d of each lever 141 is provided with a protrusion portion 141e protruding outward in the Y-axis direction and the second torsion bar 148 is connected to the protrusion portion 141e.

The pair of nonlinearity relaxation springs 149 are respectively disposed at one side and the other side of the Y-axis direction with respect to one bracket 116 of the movable mirror 11. Each nonlinearity relaxation spring 149 is connected to the movable mirror 11 through one bracket 116 and is connected to the first torsion bar 147 through the link 146, the electrode support member 144, and the bracket 145. That is, each nonlinearity relaxation spring 149 is connected between the movable mirror 11 and the first torsion bar 147. Each nonlinearity relaxation spring 149 includes a pair of plate-shaped portions 149a laid between one bracket 116 and the pair of side portions 146a of the link 146.

Each plate-shaped portion 149*a* has a flat plate shape which is perpendicular to the X-axis direction. In one nonlinearity relaxation spring 149, the pair of plate-shaped portions 149*a* face each other in the X-axis direction. In the pair of nonlinearity relaxation springs 149, the plate-shaped portion 149*a* located at one side in the X-axis direction is disposed along one plane perpendicular to the X-axis direction and the plate-shaped portion 149*a* located at the other side in the X-axis direction is disposed along another plane perpendicular to the X-axis direction.

Each plate-shaped portion 149*a* is formed to have, for example, a length (a length in the Y-axis direction) of about 380 μm, a width (a length in the X-axis direction) of about 5 to 10 μm, and a thickness (a length in the Z-axis direction) of about 70 μm. The length of each plate-shaped portion 149*a* is longer than each of the length of the first torsion bar 147 and the length of the second torsion bar 148. The width of each plate-shaped portion 149*a* is narrower than each of the width of the first torsion bar 147 and the width of the second torsion bar 148. Furthermore, when at least one of the end portion at the side of the bracket 116 and the end portion at the side of the side portion 146*a* in the plate-shaped portion 149*a* is provided with a wide portion which is wider as it goes away from the end portion, the length of the plate-shaped portion 149*a* means the length of the plate-shaped portion 149*a* without the wide portion. The same applies to each of the first torsion bar 147 and the second torsion bar 148 and to each of a first torsion bar 157, a second torsion bar 158, and a plate-shaped portion 159*a* which will be described later.

The second elastic support portion 15 includes a pair of levers 151, a pair of brackets 152, a link 153, a pair of electrode support members 154, a pair of brackets 155, a link 156, a pair of first torsion bars 157, a pair of second torsion bars 158, and a pair of nonlinearity relaxation springs 159. The pair of levers 151 extend along a plane perpendicular to the Z-axis direction from the movable mirror 11 toward both sides of the second optical function unit 18 in the Y-axis direction. In this embodiment, the pair of levers 151 extend along the main surface 12*a* of the base 12 from a gap between the movable mirror 11 and the second optical function unit 18 toward both sides of the second optical function unit 18 in the Y-axis direction.

Each lever 151 includes a first portion 151*a* which is disposed at the side of the movable mirror 11 and a second portion 151*b* which is disposed at the side opposite to the movable mirror 11 with respect to the first portion 151*a*. In the pair of levers 151, the first portions 151*a* extend obliquely so as to be separated from each other as it goes away from the movable mirror 11. Each second portion 151*b* extends along the X-axis direction.

The pair of brackets 152 are provided in a surface at the side of the movable mirror 11 in the first portion 151*a* so as to protrude toward the movable mirror 11. Each bracket 152 is bent in a crank shape to the same side (here, the side opposite to each bracket 142) when viewed from the Z-axis direction. The link 153 is laid between the end portions 151*c* at the side of the movable mirror 11 in the levers 151. The link 153 extends along the Y-axis direction.

Each electrode support member 154 has a rectangular shape when viewed from the Z-axis direction. One electrode support member 154 extends between one lever 151 and the movable mirror 11 and protrudes outward in relation to the movable mirror 11 in the Y-axis direction. The other electrode support member 154 extends between the other lever 151 and the movable mirror 11 and protrudes outward in relation to the movable mirror 11 in the Y-axis direction. The pair of electrode support members 154 are disposed on the same center line parallel to the Y-axis direction when viewed from the Z-axis direction.

The pair of brackets 155 are provided in a surface at the side of the second optical function unit 18 in the electrode support member 154 so as to protrude toward the second optical function unit 18. Each bracket 155 is bent in a crank shape to the same side (here, the side opposite to each bracket 152) when viewed from the Z-axis direction. The front end portion of one bracket 155 faces the front end portion of one bracket 152 in the Y-axis direction. The front end portion of the other bracket 155 faces the front end portion of the other bracket 152 in the Y-axis direction.

The link 156 is laid between the inner end portions of the electrode support members 154. The link 156 is formed in a substantially U-shape which is opened toward the movable mirror 11 when viewed from the Z-axis direction. The link 156 faces the other bracket 116 of the movable mirror 11 in the Y-axis direction. More specifically, the link 156 includes a pair of side portions 156*a* extending in the X-axis direction and facing each other in the Y-axis direction and the other bracket 116 is disposed between the pair of side portions 156*a*.

The first torsion bar 157 is laid between the front end portion of one bracket 152 and the front end portion of one bracket 155 and between the front end portion of the other bracket 152 and the front end portion of the other bracket 155. The first torsion bar 157 is laid between the bracket 152 and the bracket 155 bent in a crank shape to the opposite side. That is, the end portion 151*c* of each lever 151 is connected to the electrode support member 154 through the first torsion bar 157. The pair of first torsion bars 157 are disposed on the same axis parallel to the Y-axis direction.

The second torsion bar 158 is laid between the base 12 and the end portion 151*d* at the side opposite to the movable mirror 11 in one lever 151 and between the base 12 and the end portion 151*d* at the side opposite to the movable mirror 11 in the other lever 151. That is, the end portion 151*d* of each lever 151 is connected to the base 12 through the second torsion bar 158. The pair of second torsion bars 158 are disposed on the same axis parallel to the Y-axis direction. The end portion 151*d* of each lever 151 is provided with a protrusion portion 151*e* protruding outward in the Y-axis direction and the second torsion bar 158 is connected to the protrusion portion 151*e*.

The pair of nonlinearity relaxation springs 159 are respectively disposed at one side and the other side of the Y-axis direction with respect to the other bracket 116 of the movable mirror 11. Each nonlinearity relaxation spring 159 is connected to the movable mirror 11 through the other bracket 116 and is connected to the first torsion bar 157 through the link 156, the electrode support member 154, and the bracket 155. That is, each nonlinearity relaxation spring 159 is disposed between the movable mirror 11 and the first torsion bar 157. Each nonlinearity relaxation spring 159 includes a pair of plate-shaped portions 159*a* laid between the other bracket 116 and the pair of side portions 156*a* of the link 156.

Each plate-shaped portion 159*a* has a flat plate shape which is perpendicular to the X-axis direction. In one nonlinearity relaxation spring 159, the pair of plate-shaped portions 159*a* face each other in the X-axis direction. In the pair of nonlinearity relaxation springs 159, the plate-shaped portion 159*a* located at one side in the X-axis direction is disposed along one plane perpendicular to the X-axis direction and the plate-shaped portion 159*a* located at the other side in the X-axis direction is disposed along another plane perpendicular to the X-axis direction.

Each plate-shaped portion 159a is formed in, for example, the same shape as that of the plate-shaped portion 149a. The length of each plate-shaped portion 159a is longer than each of the length of the first torsion bar 157 and the length of the second torsion bar 158. The width of each plate-shaped portion 159a is narrower than the width of the first torsion bar 157 and the width of the second torsion bar 158.

Each of the first optical function unit 17 and the second optical function unit 18 is a light passage opening portion formed in the SOI substrate 50. Each of the first optical function unit 17 and the second optical function unit 18 has a circular cross-sectional shape when viewed from the Z-axis direction, but may be formed in any shape such as an octagonal cross-sectional shape. The first optical function unit 17 and the second optical function unit 18 may be void and may be formed of a material having optical transparency with respect to the measurement light L0.

The first elastic support portion 14 and the second elastic support portion 15 do not have a symmetrical structure with respect to a plane passing through the center of the movable mirror 11 and perpendicular to the X-axis direction and a plane passing through the center of the movable mirror 11 and perpendicular to the Y-axis direction. Here, a portion excluding the pair of brackets 142 and the pair of brackets 145 in the first elastic support portion 14 and a portion excluding the pair of brackets 152 and the pair of brackets 155 in the second elastic support portion 15 have a symmetrical structure with respect to a plane passing through the center of the movable mirror 11 and perpendicular to the X-axis direction and a plane passing through the center of the movable mirror 11 and perpendicular to the Y-axis direction.

The actuator 16 moves the movable mirror 11 along the Z-axis direction. The actuator 16 includes a pair of first comb electrodes 161, a pair of second comb electrodes 162, a pair of first comb electrodes 163, and a pair of second comb electrodes 164. The first comb electrodes 161 and 163 are fixed comb electrodes of which positions are fixed and the second comb electrodes 162 and 164 are movable comb electrodes which move in accordance with the movement of the movable mirror 11.

One first comb electrode 161 is provided in a surface facing one electrode support member 144 in the device layer 52 of the base 12. The other first comb electrode 161 is provided in a surface facing the other electrode support member 144 in the device layer 52. Each first comb electrode 161 includes a plurality of first comb fingers 161a extending along a plane perpendicular to the Y-axis direction. The first comb fingers 161a are arranged side by side with a predetermined interval in the Y-axis direction.

One second comb electrode 162 is provided in each of a surface at the side of the movable mirror 11 and a surface at the side of the lever 141 in one electrode support member 144. The other second comb electrode 162 is provided in each of a surface at the side of the movable mirror 11 and a surface at the side of the lever 141 in the other electrode support member 144. Each second comb electrode 162 includes a portion located between the movable mirror 11 and the lever 141 when viewed from the Z-axis direction. Each second comb electrode 162 includes a plurality of second comb fingers 162a extending along a plane perpendicular to the Y-axis direction. The second comb fingers 162a are arranged side by side with a predetermined interval in the Y-axis direction.

In one first comb electrode 161 and one second comb electrode 162, the plurality of first comb fingers 161a and the plurality of second comb fingers 162a are alternately arranged. That is, each first comb finger 161a of one first comb electrode 161 is located between the respective second comb fingers 162a of one second comb electrode 162. In the other first comb electrode 161 and the other second comb electrode 162, the plurality of first comb fingers 161a and the plurality of second comb fingers 162a are alternately arranged. That is, each first comb finger 161a of the other first comb electrode 161 is located between the respective second comb fingers 162a of the other second comb electrode 162. In the pair of first comb electrodes 161 and the pair of second comb electrodes 162, the first comb finger 161a and the second comb finger 162a which are adjacent to each other face each other in the Y-axis direction. A distance between the first comb finger 161a and the second comb finger 162a which are adjacent to each other is, for example, about several µm.

One first comb electrode 163 is provided in a surface facing one electrode support member 154 in the device layer 52 of the base 12. The other first comb electrode 163 is provided in a surface facing the other electrode support member 154 in the device layer 52. Each first comb electrode 163 includes a plurality of first comb fingers 163a extending along a plane perpendicular to the Y-axis direction. The first comb fingers 163a are arranged side by side with a predetermined interval in the Y-axis direction.

One second comb electrode 164 is provided in each of a surface at the side of the movable mirror 11 and a surface at the side of the lever 151 in one electrode support member 154. The other second comb electrode 164 is provided in each of a surface at the side of the movable mirror 11 and a surface at the side of the lever 151 in the other electrode support member 154. Each second comb electrode 164 includes a portion located between the movable mirror 11 and the lever 151 when viewed from the Z-axis direction. Each second comb electrode 164 includes a plurality of second comb fingers 164a extending along a plane perpendicular to the Y-axis direction. The second comb fingers 164a are arranged side by side with a predetermined interval in the Y-axis direction.

In one first comb electrode 163 and one second comb electrode 164, the plurality of first comb fingers 163a and the plurality of second comb fingers 164a are alternately arranged. That is, each first comb finger 163a of one first comb electrode 163 is located between the respective second comb fingers 164a of one second comb electrode 164. In the other first comb electrode 163 and the other second comb electrode 164, the plurality of first comb fingers 163a and the plurality of second comb fingers 164a are alternately arranged. That is, each first comb finger 163a of the other first comb electrode 163 is located between the respective second comb fingers 164a of the other second comb electrode 164. In the pair of first comb electrodes 163 and the pair of second comb electrodes 164, the first comb finger 163a and the second comb finger 164a which are adjacent to each other face each other in the Y-axis direction. A distance between the first comb finger 163a and the second comb finger 164a which are adjacent to each other is, for example, about several µm.

The base 12 is provided with a plurality of electrode pads 121 and 122. Each of the electrode pads 121 and 122 is formed in a surface of the device layer 52 inside an opening 12c formed in the main surface 12b of the base 12 so as to reach the device layer 52. Each electrode pad 121 is electrically connected to the first comb electrode 161 or the first comb electrode 163 through the device layer 52. Each electrode pad 122 is electrically connected to the second comb electrode 162 or the second comb electrode 164 through the first elastic support portion 14 and the main body 111 of the movable mirror 11 or the second elastic support portion 15 and the main body 111 of the movable mirror 11. The wire 26 is laid between each of the electrode pads 121 and 122 and each lead pin 25.

In the optical device 10 with the above-described configuration, when a voltage is applied across the plurality of electrode pads 121 and the plurality of electrode pads 122 through the plurality of lead pins 25 and the plurality of wires 26, an electrostatic force is generated between the first comb electrodes 161 and 163 and the second comb electrodes 162 and 164 facing each other so as to move, for example, the movable mirror 11 toward one side in the Z-axis direction. At this time, in the first elastic support portion 14 and the second elastic support portion 15, the torsion bars 147, 148, 157, and 158 are twisted so that an elastic force is generated in the first elastic support portion 14 and the second elastic support portion 15. In the optical device 10, when a periodic electric signal is applied to the drive unit 13 through the plurality of lead pins 25 and the plurality of wires 26, the movable mirror 11 can be reciprocated along the Z-axis direction at the resonant frequency level. In this way, the drive unit 13 functions as an electrostatic actuator.

Figure 4:
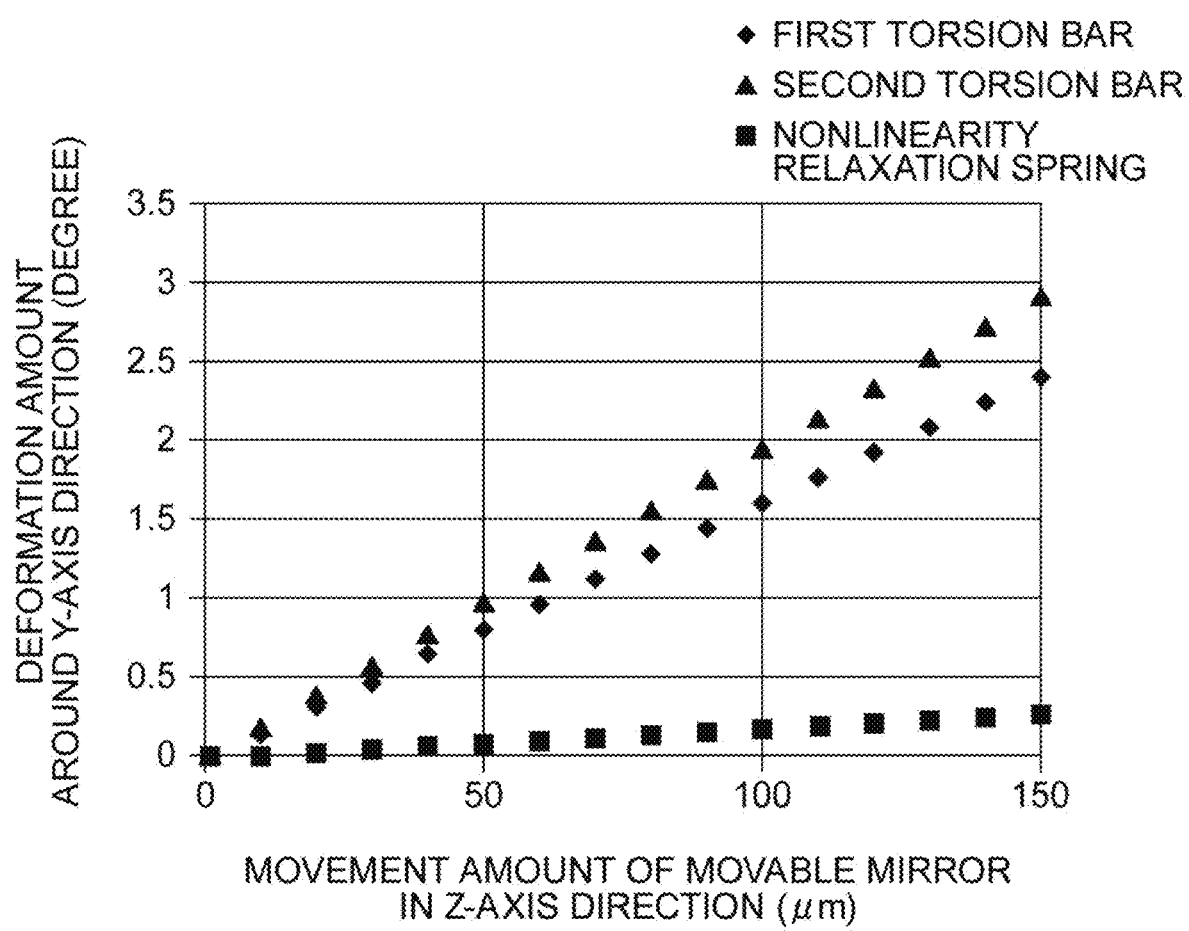
FIG. 4 is a graph showing a change in deformation amount of a torsion bar and a nonlinearity relaxation spring around a Y-axis direction with respect to a movement amount of a movable mirror.
Figure 5:
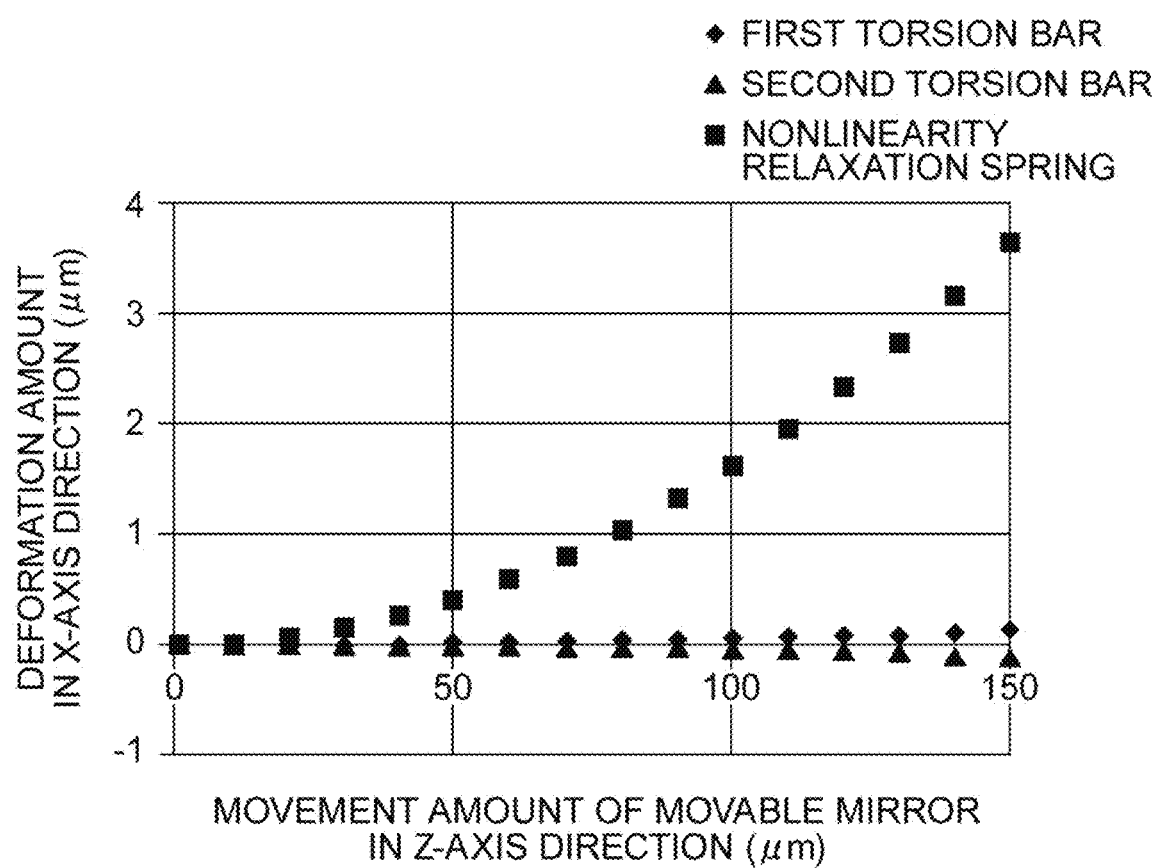
FIG. 5 is a graph showing a change in deformation amount of a torsion bar and a nonlinearity relaxation spring in an X-axis direction with respect to the movement amount of the movable mirror.

FIG. 4 is a graph showing a change in the deformation amount of the first torsion bar 147, the second torsion bar 148, and the nonlinearity relaxation spring 149 around the Y-axis direction with respect to the movement amount of the movable mirror 11 in the Z-axis direction. FIG. 5 is a graph showing a change in the deformation amount of the first torsion bar 147, the second torsion bar 148, and the nonlinearity relaxation spring 149 in the X-axis direction with respect to the movement amount of the movable mirror 11 in the Z-axis direction. Furthermore, the deformation amount of the first torsion bar 147, the second torsion bar 148, and the nonlinearity relaxation spring 149 around the Y-axis direction means, for example, an absolute value of a twist amount (twist angle). The deformation amount of the first torsion bar 147, the second torsion bar 148, and the nonlinearity relaxation spring 149 in the X-axis direction means, for example, an absolute value of bending. The deformation amount of the nonlinearity relaxation spring 149 around the Y-axis direction means, for example, the deformation amount of one plate-shaped portion 149a constituting the nonlinearity relaxation spring 149 around the Y-axis direction. The deformation amount of the nonlinearity relaxation spring 149 in the X-axis direction means, for example, the deformation amount of one plate-shaped portion 149a constituting the nonlinearity relaxation spring 149 in the X-axis direction. The deformation amount of a certain member around the Y-axis direction means the deformation amount of the member in the circumferential direction of the circle about the axis parallel to the Y axis and passing through the center of the member.

As shown in FIG. 4, when the movable mirror 11 moves in the Z-axis direction, each of the first torsion bar 147, the second torsion bar 148, and the nonlinearity relaxation spring 149 is deformed in the same direction around the Y-axis direction. When the movement amount of the movable mirror 11 increases, the deformation amount of each of the first torsion bar 147, the second torsion bar 148, and the nonlinearity relaxation spring 149 around the Y-axis direction linearly increases. Comparing the deformation amount of respective members around the Y-axis direction, when the movement amount of the movable mirror 11 is the same, the deformation amount of the first torsion bar 147 is smaller than the deformation amount of the second torsion bar 148 and the deformation amount of the nonlinearity relaxation spring 149 is much smaller than each of the deformation amount of the first torsion bar 147 and the deformation amount of the second torsion bar 148.

As shown in FIG. 5, when the movable mirror 11 moves in the Z-axis direction, the nonlinearity relaxation spring 149 is largely deformed in the X-axis direction and the first torsion bar 147 and the second torsion bar 148 are not substantially deformed in the X-axis direction. The deformation direction of the first torsion bar 147 is the same as the deformation direction of the nonlinearity relaxation spring 149 and is opposite to the deformation direction of the second torsion bar 148. When the movement amount of the movable mirror 11 increases, the deformation amount of the nonlinearity relaxation spring 149 in the X-axis direction increases quadratically. Comparing the deformation amount in the X-axis direction of respective members, when the movement amount of the movable mirror 11 is the same, the deformation amount of the first torsion bar 147 is substantially the same as the deformation amount of the second torsion bar 148 and the deformation amount of the nonlinearity relaxation spring 149 is much larger than each of the deformation amount of the first torsion bar 147 and the deformation amount of the second torsion bar 148.

In this way, the nonlinearity relaxation spring 149 is configured so that the deformation amount of the nonlinearity relaxation spring 149 around the Y-axis direction is smaller than the deformation amount of each of the torsion bars 147 and 148 around the Y-axis direction and the deformation amount of the nonlinearity relaxation spring 149 in the X-axis direction is larger than the deformation amount of each of the torsion bars 147 and 148 in the X-axis direction while the movable mirror 11 moves in the Z-axis direction. Similarly, the nonlinearity relaxation spring 159 is configured so that the deformation amount of the nonlinearity relaxation spring 159 around the Y-axis direction is smaller than the deformation amount of each of the torsion bars 157 and 158 around the Y-axis direction and the deformation amount of the nonlinearity relaxation spring 159 in the X-axis direction is larger than the deformation amount of each of the torsion bars 157 and 158 in the X-axis direction while the movable mirror 11 moves in the Z-axis direction. Furthermore, a relationship between the deformation amount around the Y-axis direction and the deformation amount in the X-axis direction of these members may be satisfied within a predetermined movable range of the movable mirror 11.

Next, function and effects of the optical device 10 will be described with reference to FIGS. 6 and 7. FIGS. 6 and 7 illustrate that a part of the configuration of the optical device 10 when viewed from the Y-axis direction is simplified. FIG. 6 is a diagram illustrating a comparative example and FIG. 7 is a diagram illustrating the optical device 10 of the above-described embodiment. The comparative example corresponds to an example in which the nonlinearity relaxation springs 149 and 159 are not provided in the optical device 10 of the above-described embodiment and each bracket 116 is connected to the electrode support members 144 and 154 by a rigid member. A movable mirror 1011, levers 1141 and 1151, first torsion bars 1147 and 1157, and second torsion bars 1148 and 1158 of the comparative example respectively correspond to the movable mirror 11, the levers 141 and 151, the first torsion bars 147 and 157, and the second torsion bars 148 and 158 of the optical device 10 of the above-described embodiment.

Hereinafter, the side of the first torsion bar 1157 is exemplified, but the same applies to the side of the first torsion bar 1147. As illustrated in FIG. 6, assuming that the first torsion bar 1157 moves only by the torsional deformation of the second torsion bar 1158 when the movable mirror 1011 of the comparative example moves in the Z-axis direction, the first torsion bar 1157 moves to the position B and moves away from the movable mirror 1011 by the distance L between the position A and the position B. For that reason, the first torsion bar 1157 and the second torsion bar 1158 are actually bent and deformed in the X-axis direction by the distance L. That is, in the comparative example, when the movable mirror 1011 moves in the Z-axis direction, the first torsion bar 1157 and the second torsion bar 1158 are twisted in a bent state. For this reason, nonlinearity occurs in torsional deformation of the first torsion bar 1157 and the second torsion bar 1158. When such nonlinearity exists, there is concern that the control characteristic of the movable mirror 11 may be deteriorated as will be described later.

In contrast, as illustrated in FIG. 7, when the movable mirror 11 in the optical device 10 moves in the Z-axis direction, the nonlinearity relaxation spring 159 is deformed in the X-axis direction so as to be larger than the first torsion bar 157 and the second torsion bar 158 while being deformed around the Y-axis direction so as to be smaller than the first torsion bar 157 and the second torsion bar 158. Accordingly, it is possible to suppress the first torsion bar 157 and the second torsion bar 158 from being bent and deformed in the X-axis direction. As a result, it is possible to suppress nonlinearity in torsional deformation of the first torsion bar 157 and the second torsion bar 158.

On the other hand, when the nonlinearity relaxation springs 149 and 159 are provided as in the optical device 10, the movement amount of the second comb electrodes 162 and 164 in the X-axis direction tends to increase relatively when an external force is exerted. In contrast, in the optical device 10, because the first comb finger 161a and the second comb finger 162a which are adjacent to each other face each other in the Y-axis direction and the first comb finger 163a and the second comb finger 164a which are adjacent to each other face each other in the Y-axis direction, the first comb fingers 161a and 163a and the second comb fingers 162a and 164a are hard to approach each other even when the second comb electrodes 162 and 164 move in the X-axis direction. For that reason, it is possible to suppress the breakage due to the contact of the first comb fingers 161a and 163a and the second comb fingers 162a and 164a or deterioration in control characteristic of the movable mirror 11 as the first comb fingers 161a and 163a and the second comb fingers 162a and 164a approach each other. As a result, high reliability can be obtained. Thus, according to the optical device 10, high reliability can be obtained while suppressing the occurrence of nonlinearity in torsional deformation of the first torsion bars 147 and 157 and the second torsion bars 148 and 158.

In the optical device 10, the length of the plate-shaped portion 149a in the Y-axis direction is longer than the length of the first torsion bar 147 and the second torsion bar 148. Similarly, the length of the plate-shaped portion 159a in the Y-axis direction is longer than the length of the first torsion bar 157 and the second torsion bar 158. Accordingly, it is possible to effectively suppress the occurrence of nonlinearity in torsional deformation of the first torsion bars 147 and 157 and the second torsion bars 148 and 158.

In the optical device 10, the pair of plate-shaped portions 149a face each other in the X-axis direction. Similarly, the pair of plate-shaped portions 159a face each other in the X-axis direction. Accordingly, it is possible to effectively suppress the occurrence of nonlinearity in torsional deformation of the first torsion bars 147 and 157 and the second torsion bars 148 and 158.

In the optical device 10, the second comb electrode 162 is provided in the electrode support member 144 extending between the lever 141 and the movable mirror 11 when viewed from the Z-axis direction. Similarly, the second comb electrode 162 is provided in the electrode support member 154 extending between the lever 151 and the movable mirror 11 when viewed from the Z-axis direction. Accordingly, it is possible to secure the arrangement area of the second comb electrodes 162 and 164 and to secure the magnitude of the electrostatic force generated by the first comb electrodes 161 and 163 and the second comb electrodes 162 and 164.

In the optical device 10, the first elastic support portion 14 includes the second torsion bar 148 connected between the base 12 and the end portion 141d of the lever 141. Similarly, the second elastic support portion 15 includes the second torsion bar 158 connected between the base 12 and the end portion 151d of the lever 151. Accordingly, the movement amount of the movable mirror 11 can be increased.

Figure 8:
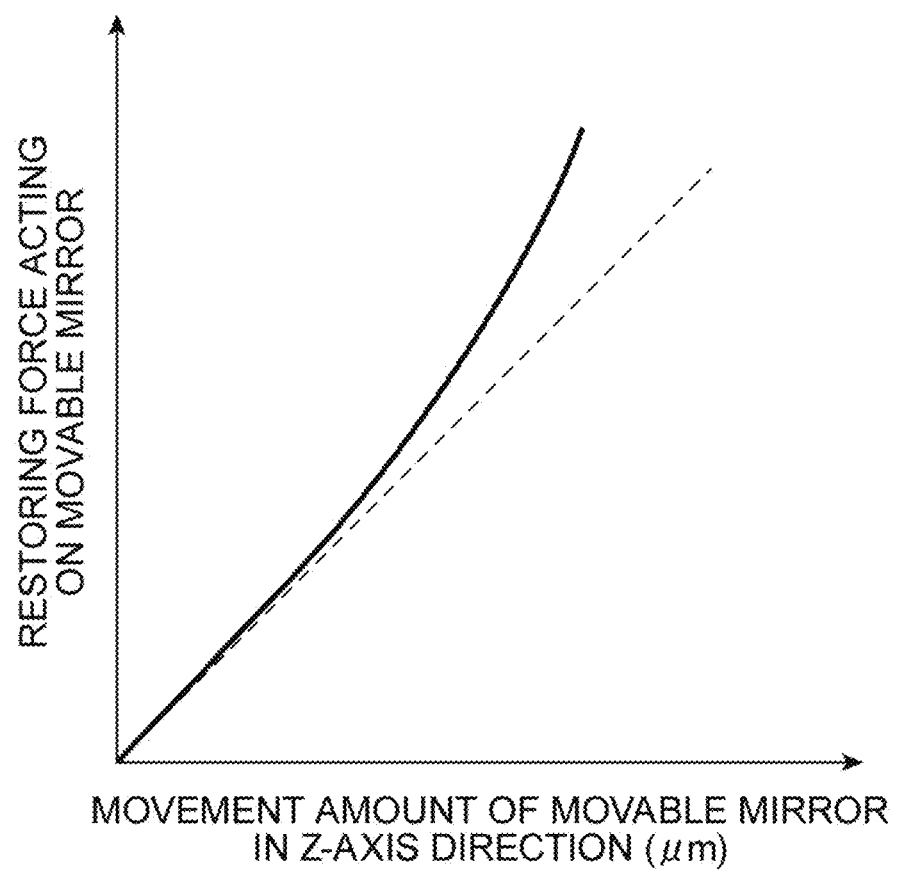
FIG. 8 is a graph showing a relationship between a movement amount of the movable mirror and a restoring force acting on the movable mirror when there is nonlinearity or not.
Figure 9:
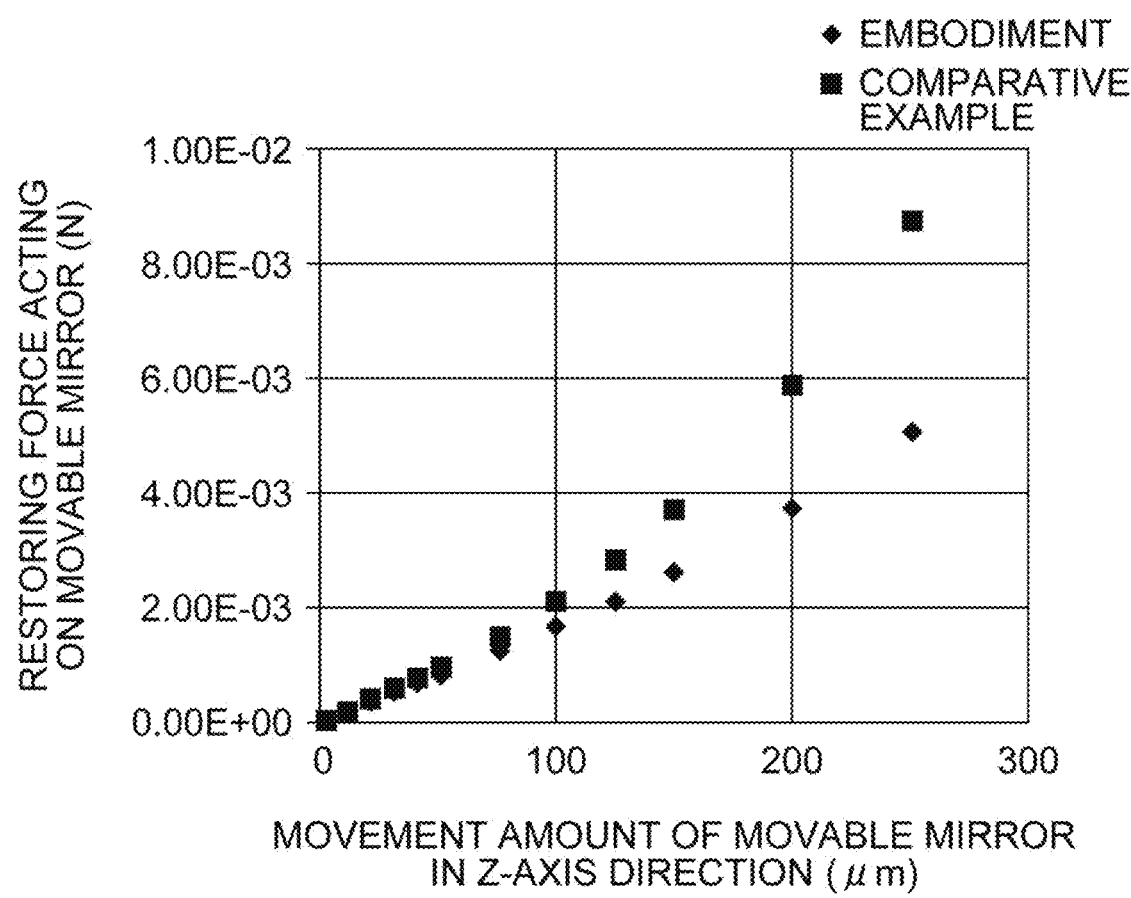
FIG. 9 is a graph showing a movement amount of the movable mirror and a restoring force acting on the movable mirror of an embodiment and a comparative example.

Here, a problem that occurs when nonlinearity exists in the torsional deformation of the first torsion bars 147 and 157 and the second torsion bars 148 and 158 will be described with reference to FIGS. 8 to 11. In FIG. 8, a relationship between the restoring force acting on the movable mirror 11 and the movement amount of the movable mirror 11 when there is no nonlinearity is indicated by a dashed line and the relationship when there is nonlinearity is indicated by a solid line. As shown in FIGS. 8 and 9, if the movement amount of the movable mirror 11 in the Z-axis direction increases when nonlinearity does not exist (decreases) as in the optical device 10, the restoring force acting on the movable mirror 11 linearly increases. Meanwhile, if the movement amount of the movable mirror 11 in the Z-axis direction increases when there is nonlinearity as in the comparative example, the restoring force acting on the movable mirror 11 increases at an accelerated rate so as to be larger than that of the optical device 10. A spring having characteristics as in the comparative example is called a hardened spring (or gradually hardened spring).

Figure 10:
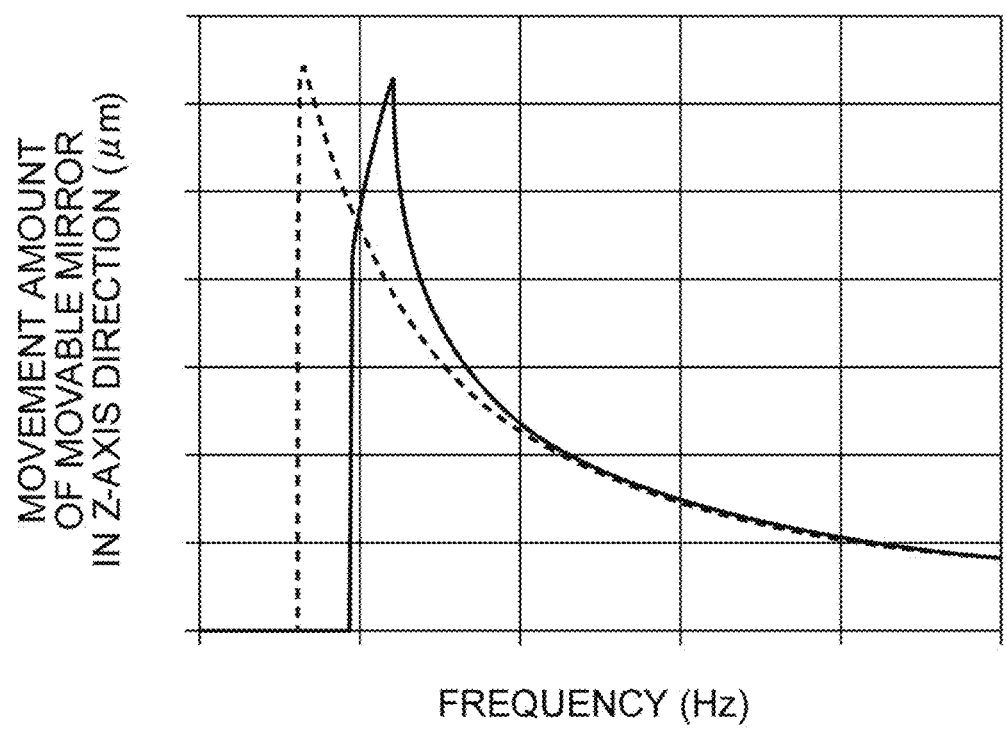
FIG. 10 is a graph showing a relationship between a driving frequency and a movement amount of the movable mirror when nonlinearity is small.
Figure 11:
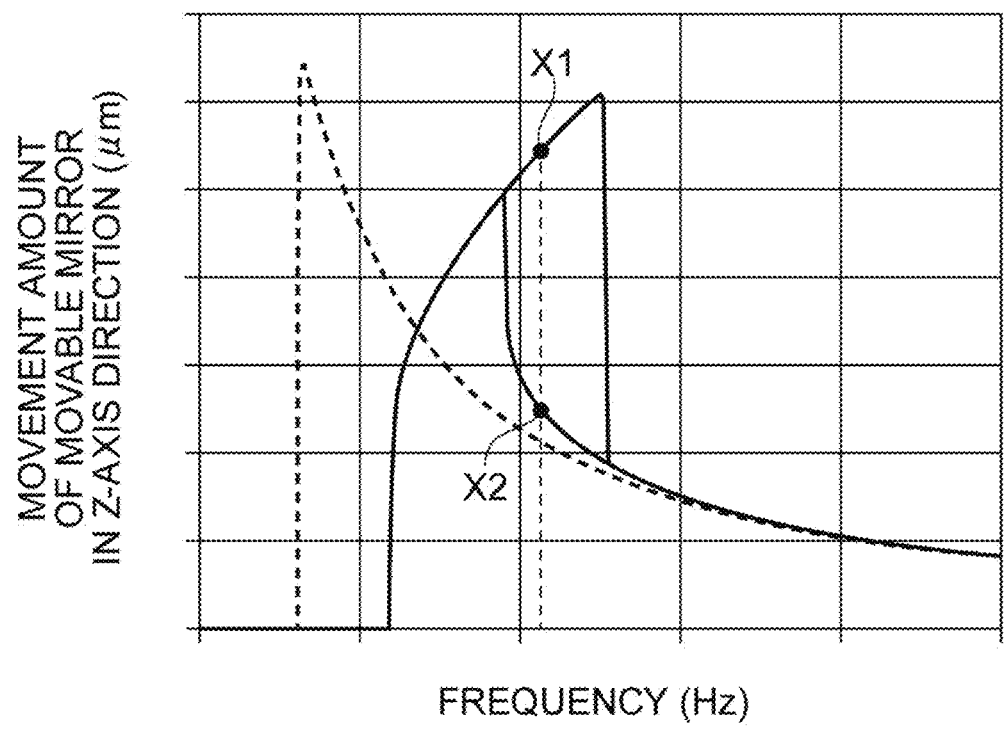
FIG. 11 is a graph showing a relationship between a driving frequency and a movement amount of the movable mirror when nonlinearity is large.

FIGS. 10 and 11 are graphs showing a relationship between the driving frequency and the movement amount of the movable mirror 11 when nonlinearity is small and large. In FIGS. 10 and 11, a frequency characteristic when there is no nonlinearity is indicated by a dashed line and a frequency characteristic when there is nonlinearity is indicated by a solid line. As shown in FIGS. 10 and 11, when there is nonlinearity, the frequency characteristic is distorted and the movement amount of the movable mirror 11 at the peak of the graph is small as compared with a case in which there is no nonlinearity. For that reason, a large force is necessary when there is nonlinearity in order to move the movable mirror 11 by the same movement amount and hence the control characteristic of the movable mirror 11 is deteriorated. Furthermore, FIGS. 10 and 11 show an example of the frequency characteristic, but the frequency characteristic is not limited thereto.

Further, as shown in FIG. 11, when the nonlinearity increases, there may be two solutions (multiple solutions) of the point X1 and the point X2 for the same driving frequency. In this case, the behavior of the movable mirror 11 is different for the case of performing a control of increasing the driving frequency from a relatively small initial value and the case of performing a control of decreasing the driving frequency from a relatively large initial value. Further, when a continuous operation is performed in a frequency range including a frequency corresponding to multiple solutions, the movement amount of the movable mirror 11 becomes a movement amount corresponding to the point X1 or corresponding to the point X2 due to external influences such as impact and vibration and hence the operation becomes unstable due to the movement amount. For that reason, because the control is complex, there is concern that the control characteristic of the movable mirror 11 may be deteriorated. Further, when there is nonlinearity, a third harmonic (a frequency component three times the target frequency) is added to the operation waveform when the operation waveform of the movable mirror 11 is controlled, for example, in a sine wave shape and hence the operation waveform cannot be controlled in a desired shape. Accordingly, there is concern that the control characteristic of the movable mirror 11 may also be deteriorated. In this way, when there is nonlinearity in torsional deformation of the first torsion bars 147 and 157 and the second torsion bars 148 and 158, there is concern that the control characteristic of the movable mirror 11 may be deteriorated. In contrast, as described above, according to the optical device 10, it is possible to suppress the occurrence of nonlinearity and to suppress deterioration in the control characteristic of the movable mirror 11.

Modified Example

As described above, an embodiment of the present disclosure has been described, but the present disclosure is not limited to the above-described embodiment. For example, the materials and shapes of each component are not limited to the materials and shapes described above and various materials and shapes can be employed. As an example, the drive unit 13 may include another elastic support portion connected to the base 12 and the movable mirror 11 in addition to the first elastic support portion 14 and the second elastic support portion 15.

As in the optical module 1, the fixed mirror 21 may be disposed not only at a position right below the first optical function unit 17 but also at a position right below the second optical function unit 18. With this configuration, it is possible to suppress deterioration in the movable performance of the movable mirror 11 and an increase in the size of the entire device while realizing multi-functionality of the device by using the second optical function unit 18 in the same manner as the first optical function unit 17. The fixed mirror 21 may be provided on the main surface 12a of the device layer 52. In this case, the light passage opening portion functioning as the first optical function unit 17 and the second optical function unit 18 is not formed in the SOI substrate 50.

Figure 12:
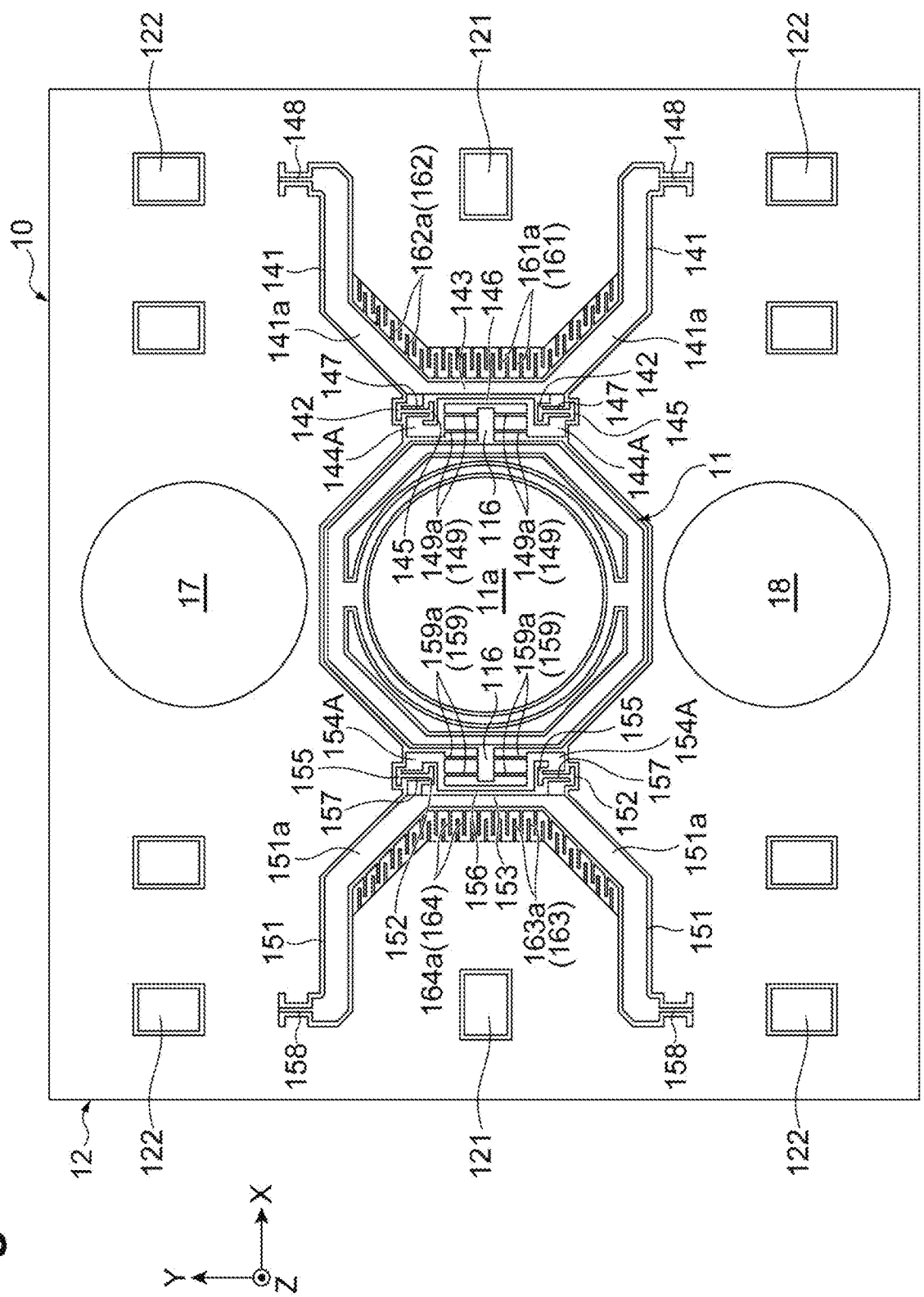
FIG. 12 is a plan view of a first modified example of the optical device.

The optical device 10 may be configured as in a first modified example illustrated in FIG. 12. In the first modified example, the second comb electrode 162 is disposed across the first portions 141a of the pair of levers 141 and the link 143. The second comb electrode 162 is provided in a surface at the side opposite to the movable mirror 11 in the first portion 141a and the link 143. The second comb electrode 164 is disposed across the first portions 151a of the pair of levers 151 and the link 153. The second comb electrode 164 is provided in a surface at the side opposite to the movable mirror 11 in the first portion 151a and the link 153.

In the first modified example, a pair of intermediate members 144A are provided instead of the pair of electrode support members 144. Each intermediate member 144A is connected to the lever 141 through the brackets 142 and 145 and the first torsion bar 147 and is connected to one bracket 116 through the link 146 and the nonlinearity relaxation spring 149. A pair of intermediate members 154A are provided instead of the pair of electrode support members 154. Each intermediate member 154A is connected to the lever 151 through the brackets 152 and 155 and the first torsion bar 157 and is connected to the bracket 116 through the link 156 and the nonlinearity relaxation spring 159. When viewed from the Z-axis direction, the first optical function unit 17 is disposed at one side of the movable mirror 11 in the Y-axis direction and the second optical function unit 18 is disposed at the other side of the movable mirror 11 in the Y-axis direction.

Even in such a first modified example, as in the above-described embodiment, high reliability can be obtained while suppressing the occurrence of nonlinearity in torsional deformation of the first torsion bars 147 and 157 and the second torsion bars 148 and 158. Further, because the second comb electrodes 162 and 164 are provided in the levers 141 and 151, it is possible to secure the arrangement area of the second comb electrodes 162 and 164 and to secure the magnitude of the electrostatic force generated by the first comb electrodes 161 and 163 and the second comb electrodes 162 and 164. Moreover, because the second comb electrodes 162 and 164 are provided across the levers 141 and 151 and the links 143 and 153, it is possible to effectively secure the arrangement area of the second comb electrodes 162 and 164 and to appropriately secure the magnitude of the electrostatic force generated by the first comb electrodes 161 and 163 and the second comb electrodes 162 and 164.

Figure 13:
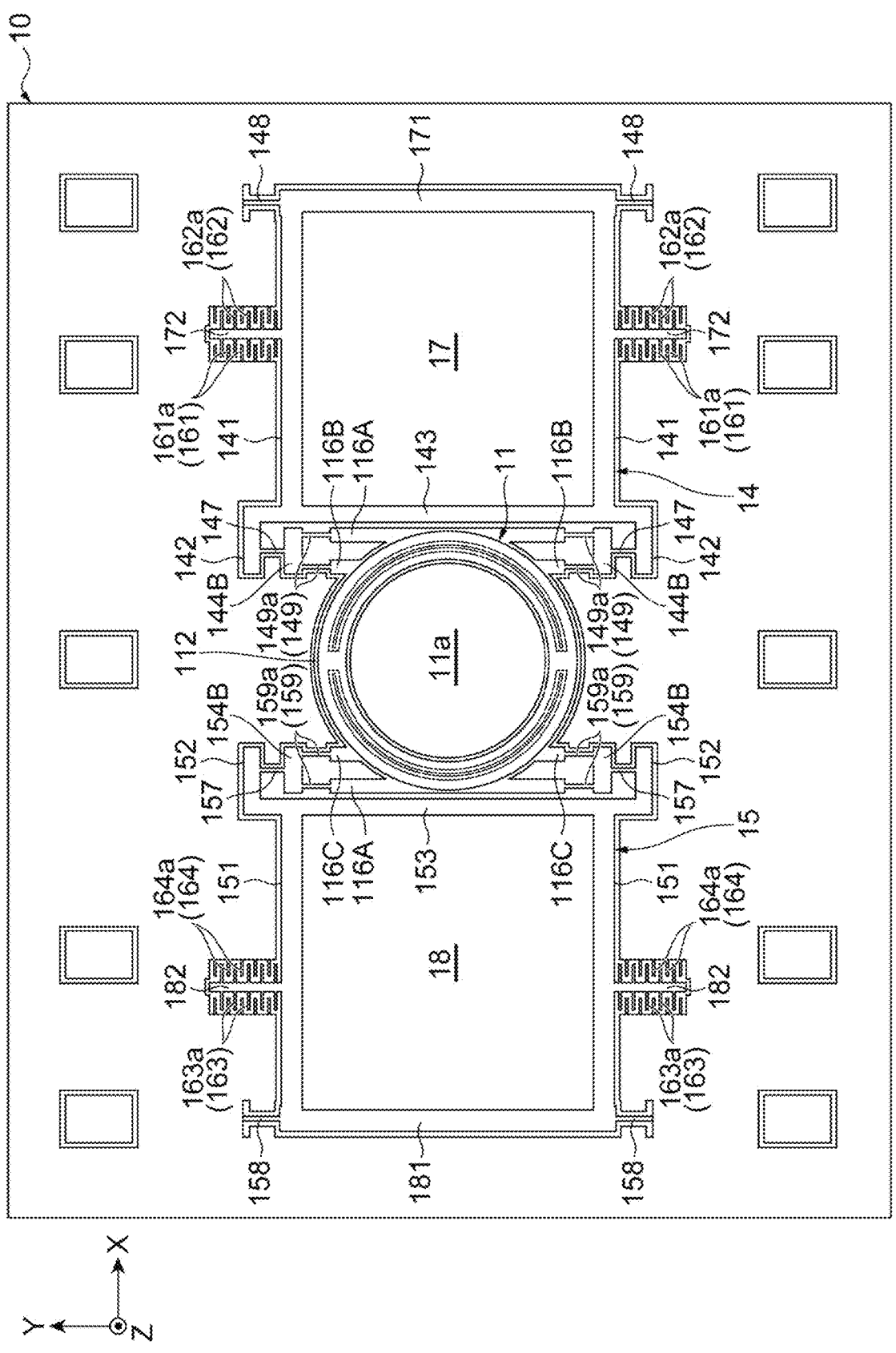
FIG. 13 is a plan view of a second modified example of the optical device.

The optical device 10 may be configured as in a second modified example illustrated in FIG. 13. In the second modified example, the inner edge and the outer edge of the annular portion 112 of the movable mirror 11 have a circular shape when viewed from the Z-axis direction. The movable mirror 11 includes a pair of brackets 116A, a pair of brackets 116B, and a pair of brackets 116C. One bracket 116A is provided in the end portion at the side of the first optical function unit 17 in the annular portion 112 so as to protrude toward one side and the other side in the Y-axis direction. The other bracket 116A is provided in the end portion at the side of the second optical function unit 18 in the annular portion 112 so as to protrude toward one side and the other side in the Y-axis direction. The pair of brackets 116B are respectively provided in the surfaces at one side and the other side of the annular portion 112 in the Y-axis direction so as to extend along one bracket 116A. The pair of brackets 116C are respectively provided in the surfaces at one side and the other side of the annular portion 112 in the Y-axis direction so as to extend along the other bracket 116A.

In the second modified example, the first elastic support portion 14 includes the pair of levers 141, the pair of brackets 142, the link 143, a pair of intermediate members 144B, the pair of first torsion bars 147, the pair of second torsion bars 148, the pair of nonlinearity relaxation springs 149, a link 171, and a pair of electrode support members 172. Each lever 141 extends along the X-axis direction. The pair of brackets 142 are bent in a crank shape to the opposite side when viewed from the Z-axis direction. Each of the pair of first torsion bars 147 is laid between the front end portion of one bracket 142 and one intermediate member 144B and between the front end portion of the other bracket 142 and the other intermediate member 144B. In one nonlinearity relaxation spring 149, one plate-shaped portion 149a is laid between one intermediate member 144B and one bracket 116A and the other plate-shaped portion 149a is laid between one intermediate member 144B and one bracket 116B. In the other nonlinearity relaxation spring 149, one plate-shaped portion 149a is laid between the other intermediate member 144B and the other bracket 116A and the other plate-shaped portion 149a is laid between the other intermediate member 144B and the other bracket 116B. Also in the second modified example, the nonlinearity relaxation spring 149 is configured so that the deformation amount of the nonlinearity relaxation spring 149 around the Y-axis direction is smaller than the deformation amount of each of the torsion bars 147 and 148 around the Y-axis direction and the deformation amount of the nonlinearity relaxation spring 149 in the X-axis direction is larger than the deformation amount of each of the torsion bars 147 and 148 in the X-axis direction while the movable mirror 11 moves in the Z-axis direction.

The link 171 is laid between the end portions opposite to the movable mirror 11 in the levers 141. Each electrode support member 172 has a rectangular shape when viewed from the Z-axis direction. The pair of electrode support members 172 are respectively provided in the outer edge portions of the pair of levers 141 in the Y-axis direction so as to protrude outward in the Y-axis direction. The pair of electrode support members 172 respectively extend from the pair of levers 141 along the Y-axis direction. Each electrode support member 172 is disposed at the outside in relation to the center of the lever 141 in the X-axis direction (the side opposite to the movable mirror 11 with respect to the center of the lever 141). In the second modified example, the first optical function unit 17 is not a light passage opening portion formed in the SOI substrate 50, but a light passage opening portion defined by the pair of levers 141, the link 143, and the link 171. The pair of second comb electrodes 162 are respectively provided in the pair of electrode support members 172 and the pair of first comb electrodes 161 are provided at the positions corresponding to the pair of second comb electrodes 162 in the base 12.

The second elastic support portion 15 includes the pair of levers 151, the pair of brackets 152, the link 153, a pair of intermediate members 154B, the pair of first torsion bars 157, the pair of second torsion bars 158, the pair of nonlinearity relaxation springs 159, a link 181, and a pair of electrode support members 182. Each lever 151 extends along the X-axis direction. The pair of brackets 152 are bent in a crank shape to the opposite side when viewed from the Z-axis direction. Each of the pair of first torsion bars 157 is laid between the front end portion of one bracket 152 and one intermediate member 154B and between the front end portion of the other bracket 152 and the other intermediate member 154B. In one nonlinearity relaxation spring 159, one plate-shaped portion 159a is laid between one intermediate member 154B and one bracket 116A and the other plate-shaped portion 159a is laid between one intermediate member 154B and one bracket 116C. In the other nonlinearity relaxation spring 159, one plate-shaped portion 159a is laid between the other intermediate member 154B and the other bracket 116A and the other plate-shaped portion 159a is laid between the other intermediate member 154B and the other bracket 116C. Also in the second modified example, the nonlinearity relaxation spring 159 is configured so that the deformation amount of the nonlinearity relaxation spring 159 around the Y-axis direction is smaller than the deformation amount of each of the torsion bars 157 and 158 around the Y-axis direction and the deformation amount of the nonlinearity relaxation spring 159 in the X-axis direction is larger than the deformation amount of each of the torsion bars 157 and 158 in the X-axis direction while the movable mirror 11 moves in the Z-axis direction.

The link 181 is laid between the end portions at the side opposite to the movable mirror 11 in the levers 151. Each electrode support member 182 has a rectangular shape when viewed from the Z-axis direction. The pair of electrode support members 182 are respectively provided at the outer edge portions of the pair of levers 151 in the Y-axis direction so as to protrude outward in the Y-axis direction. The pair of electrode support members 182 respectively extend from the pair of levers 151 along the Y-axis direction. Each electrode support member 182 is disposed at the outside in relation to the center of the lever 151 in the X-axis direction (the side opposite to the movable mirror 11 with respect to the center of the lever 151). In the second modified example, the second optical function unit 18 is not a light passage opening portion formed in the SOI substrate 50, but a light passage opening portion defined by the pair of levers 151, the link 153, and the link 181. The pair of second comb electrodes 164 are respectively provided in the pair of electrode support members 182 and the pair of first comb electrodes 163 are provided at the positions corresponding to the pair of second comb electrodes 164 in the base 12.

Also in such a second modified example, as in the above-described embodiment, high reliability can be obtained while suppressing the occurrence of nonlinearity in torsional deformation of the first torsion bars 147 and 157 and the second torsion bars 148 and 158. Further, the second comb electrode 162 is provided in the electrode support member 172 extending from the lever 141. Similarly, the second comb electrode 164 is provided in the electrode support member 182 extending from the lever 151. Accordingly, because the first comb electrodes 161 and 163 and the second comb electrodes 162 and 164 are disposed at a position in which a displacement amount in the Z-axis direction during a driving operation is relatively small, it is possible to suppress a decrease in the facing area between the first comb electrodes 161 and 163 and the second comb electrodes 162 and 164 caused by the displacement in the Z-axis direction. As a result, it is possible to secure the electrostatic force generated between the first comb electrodes 161 and 163 and the second comb electrodes 162 and 164 even when the movement amount of the movable mirror 11 in the Z-axis direction is increased. Moreover, because the pair of levers 141 are connected to each other by the link 171 and the pair of levers 151 are connected to each other by the link 181, it is possible to improve resistance against an impact. Moreover, because the first optical function unit 17 is disposed between the pair of levers 141 and the second optical function unit 18 is disposed between the pair of levers 151, it is possible to secure the arrangement space of the first comb electrodes 161 and 163 and the second comb electrodes 162 and 164 and to increase the number of the first comb fingers 161a and 163a and the second comb fingers 162a and 164a.

Figure 14:
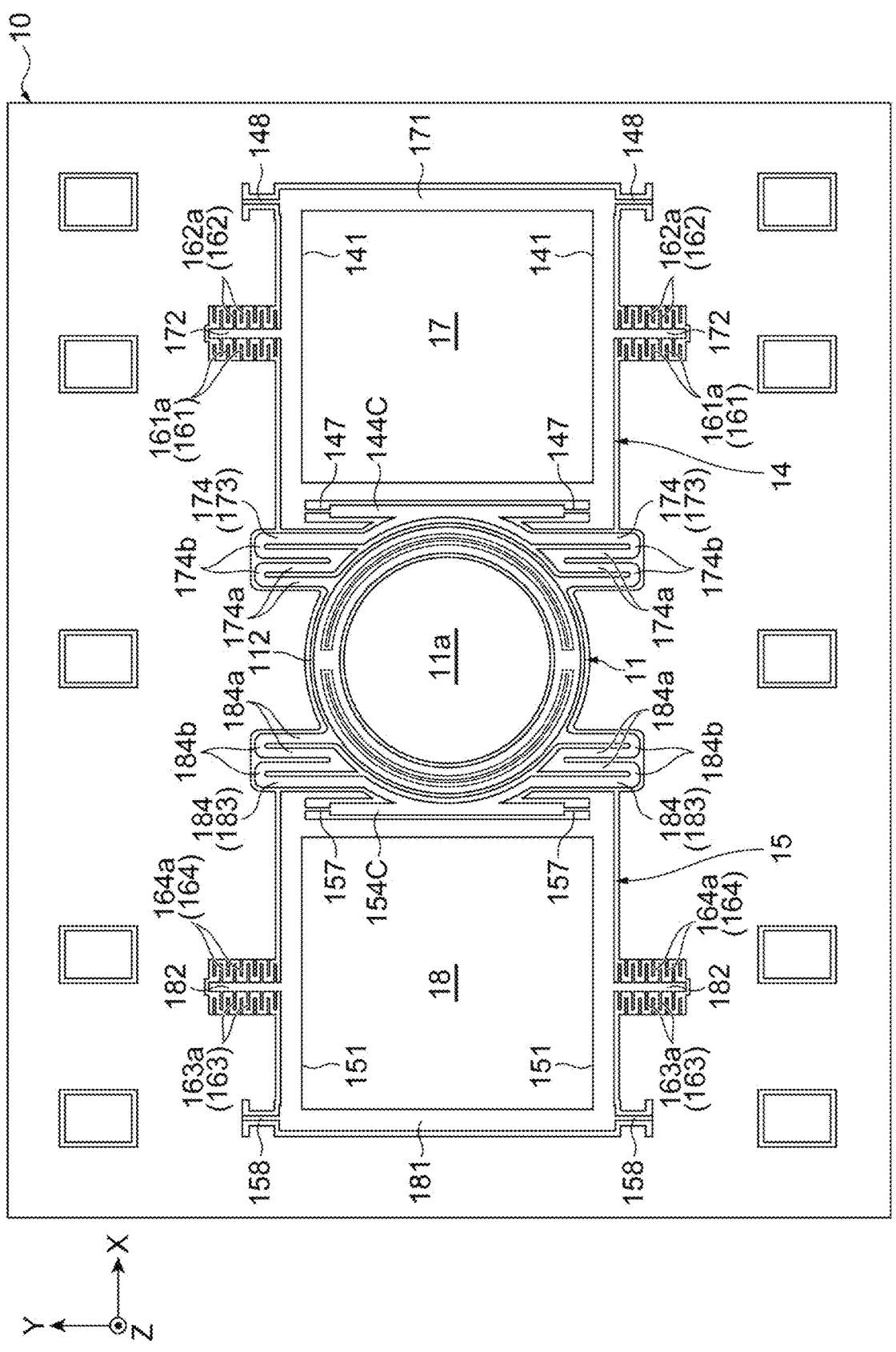
FIG. 14 is a plan view of a third modified example of the optical device.

The optical device 10 may be configured as in a third modified example illustrated in FIG. 14. The third modified example is different from the second modified example in that the movable mirror 11 does not include the brackets 116A to 116C, the first elastic support portion 14 includes an intermediate member 144C instead of the intermediate member 144B, the second elastic support portion 15 includes an intermediate member 154C instead of the intermediate member 154B, the first elastic support portion 14 includes a pair of nonlinearity relaxation springs 173 instead of the pair of nonlinearity relaxation springs 149, and the second elastic support portion 15 includes a pair of nonlinearity relaxation springs 183 instead of the pair of nonlinearity relaxation springs 159. The intermediate member 144C is disposed at the side of the first optical function unit 17 with respect to the movable mirror 11 and extends along the Y-axis direction. The intermediate member 144C is connected to the first torsion bar 147 and the nonlinearity relaxation spring 173 at both end portions in the Y-axis direction. The intermediate member 154C is disposed at the side of the second optical function unit 18 with respect to the movable mirror 11 and extends along the Y-axis direction. The intermediate member 154C is connected to the first torsion bar 157 and the nonlinearity relaxation spring 183 at both end portions in the Y-axis direction.

Each nonlinearity relaxation spring 173 includes a meandering portion 174 which extends in a meandering manner when viewed from the Z-axis direction. The meandering portion 174 includes a plurality of linear portions 174a which extend in the Y-axis direction and are arranged in the X-axis direction and a plurality of folded portions 174b which alternately connect both ends of the plurality of linear portions 174a. One end portion of the meandering portion 174 is connected to the intermediate member 144C and the other end portion thereof is connected to the annular portion 112. A portion at the side of the annular portion 112 in the meandering portion 174 has a shape following the outer edge of the annular portion 112. The nonlinearity relaxation spring 173 is configured so that the deformation amount of the nonlinearity relaxation spring 173 around the Y-axis direction is smaller than the deformation amount of each of the torsion bars 147 and 148 around the Y-axis direction and the deformation amount of the nonlinearity relaxation spring 173 in the X-axis direction is larger than the deformation amount of each of the torsion bars 147 and 148 in the X-axis direction while the movable mirror 11 moves in the Z-axis direction.

Each nonlinearity relaxation spring 183 includes a meandering portion 184 which extends in a meandering manner when viewed from the Z-axis direction. The meandering portion 184 includes a plurality of linear portions 184a which extend in the Y-axis direction and are arranged in the X-axis direction and a plurality of folded portions 184b which alternately connect both ends of the plurality of linear portions 184a. One end portion of the meandering portion 184 is connected to the intermediate member 154C and the other end portion thereof is connected to the annular portion 112. A portion at the side of the annular portion 112 in the meandering portion 184 has a shape following the outer edge of the annular portion 112. The nonlinearity relaxation spring 183 is configured so that the deformation amount of the nonlinearity relaxation spring 183 around the Y-axis direction is smaller than the deformation amount of each of the torsion bars 147 and 148 around the Y-axis direction and the deformation amount of the nonlinearity relaxation spring 183 in the X-axis direction is larger than the deformation amount of each of the torsion bars 147 and 148 in the X-axis direction while the movable mirror 11 moves in the Z-axis direction.

Also in such a third modified example, as in the above-described embodiment, high reliability can be obtained while suppressing the occurrence of nonlinearity in torsional deformation of the first torsion bars 147 and 157 and the second torsion bars 148 and 158. Further, because the first comb electrodes 161 and 163 and the second comb electrodes 162 and 164 are disposed at a position in which a displacement amount in the Z-axis direction during a driving operation is relatively small, it is possible to suppress a decrease in the facing area between the first comb electrodes 161 and 163 and the second comb electrodes 162 and 164 caused by the displacement in the Z-axis direction. As a result, it is possible to secure the electrostatic force generated between the first comb electrodes 161 and 163 and the second comb electrodes 162 and 164 even when the movement amount of the movable mirror 11 in the Z-axis direction is increased. Moreover, because the pair of levers 141 are connected to each other by the link 171 and the pair of levers 151 are connected to each other by the link 181, it is possible to improve resistance against an impact. Moreover, because the first optical function unit 17 is disposed between the pair of levers 141 and the second optical function unit 18 is disposed between the pair of levers 151, it is possible to secure the arrangement space of the first comb electrodes 161 and 163 and the second comb electrodes 162 and 164 and to increase the number of the first comb fingers 161a and 163a and the second comb fingers 162a and 164a.

The nonlinearity relaxation spring 149 is not limited to the above-described embodiment. For example, the length of the plate-shaped portion 149a in the Y-axis direction may be equal to or smaller than the length of the torsion bars 147 and 148. The width of the plate-shaped portion 149a (the length in the X-axis direction) may be equal to or larger than the width of the torsion bars 147 and 148. The plate-shaped portion 149a may extend so as to be inclined with respect to the Z-axis direction or the Y-axis direction. The nonlinearity relaxation spring 149 may include single or three or more plate-shaped portions 149a. In the above-described embodiment, the pair of nonlinearity relaxation springs 149 are provided in the first elastic support portion 14, but single or three or more nonlinearity relaxation springs 149 may be provided. The nonlinearity relaxation spring 149 may not include the plate-shaped portion 149a. The same applies to the nonlinearity relaxation spring 159.

In the above-described embodiment, the first comb finger 161a and the second comb finger 162a which are adjacent to each other may face each other in the Y-axis direction and at least one of the first comb fingers 161a and the second comb fingers 162a may extend so as to be inclined with respect to a plane perpendicular to the Y-axis direction. Alternatively, at least one of the first comb fingers 161a and the second comb fingers 162a may be bent in an arcuate shape when viewed from the Z-axis direction. The same applies to the first comb fingers 163a and the second comb fingers 164a. The second comb electrode 162 may be provided in the movable mirror 11 or may be provided in both of the first elastic support portion 14 and the movable mirror 11. Similarly, the second comb electrode 164 may be provided in the movable mirror 11 or may be provided in both of the second elastic support portion 15 and the movable mirror 11. In the above-described embodiment, the optical device 10 may include a movable portion provided with another optical function unit other than the mirror surface 11a instead of the movable mirror 11. As another optical function unit, for example, a lens or the like can be exemplified. The optical module 1 is not limited to one constituting the FTIR and may be one constituting another optical system. The first torsion bars 147 and 157 and the second torsion bars 148 and 158 may be torsionally deformable and may have any shape such as a plate shape or a rod shape.

REFERENCE SIGNS LIST

10: optical device, 11: movable mirror (movable portion), 11a: mirror surface (optical function unit), 12: base, 14:

first elastic support portion, 15: second elastic support portion, 141, 151: lever, 141c, 151c: end portion (one end portion), 141d, 151d: end portion (other end portion), 144, 154: electrode support member, 146, 156: link, 147, 157: first torsion bar, 148, 158: second torsion bar, 149, 159: nonlinearity relaxation spring, 149a, 159a: plate-shaped portion, 161, 163: first comb electrode, 161a, 163a: first comb finger, 162, 164: second comb electrode, 162a, 164a: second comb finger, 174, 184: meandering portion.

The invention claimed is:

1. An optical device comprising:
a base;
a movable portion which includes an optical function unit;
an elastic support portion which is connected between the base and the movable portion and supports the movable portion so that the movable portion is movable along a first direction;
a first comb electrode which is provided to the base and includes a plurality of first comb fingers; and
a second comb electrode which is provided to at least one of the movable portion and the elastic support portion and includes a plurality of second comb fingers alternately arranged with the plurality of first comb fingers,
wherein the elastic support portion includes a torsion bar extending along a second direction perpendicular to the first direction and a nonlinearity relaxation spring connected between the torsion bar and the movable portion,
wherein the nonlinearity relaxation spring is configured so that a deformation amount of the nonlinearity relaxation spring around the second direction is smaller than a deformation amount of the torsion bar around the second direction and a deformation amount of the nonlinearity relaxation spring in a third direction perpendicular to the first direction and the second direction is larger than a deformation amount of the torsion bar in the third direction while the movable portion moves in the first direction, and
wherein the first comb finger and the second comb finger which are adjacent to each other face each other in the second direction.

2. The optical device according to claim 1,
wherein the nonlinearity relaxation spring includes a plate-shaped portion and the length of the plate-shaped portion in the second direction is longer than the length of the torsion bar.

3. The optical device according to claim 1,
wherein the nonlinearity relaxation spring includes a pair of plate-shaped portions, and
wherein the pair of plate-shaped portions face each other in the third direction.

4. The optical device according to claim 1,
wherein the elastic support portion further includes a lever connected to the nonlinearity relaxation spring through the torsion bar at one end portion and an electrode support member extending between the lever and the movable portion when viewed from the first direction, and
wherein the second comb electrode is provided to the electrode support member.

5. The optical device according to claim 1,
wherein the elastic support portion further includes a lever connected to the nonlinearity relaxation spring through the torsion bar at one end portion, and
wherein the second comb electrode is provided to the lever.

6. The optical device according to claim 5,
wherein the elastic support portion includes a pair of the levers and further includes a link bridges the pair of levers, and
wherein the second comb electrode is disposed across the pair of levers and the link.

7. The optical device according to claim 5,
wherein the elastic support portion further includes a torsion bar connected between the other end portion of the lever and the base.

8. The optical device according to claim 1,
wherein the elastic support portion further includes a lever connected to the nonlinearity relaxation spring through the torsion bar at one end portion and a torsion bar connected between the other end portion of the lever and the base.

9. The optical device according to claim 1,
wherein the elastic support portion includes a lever connected to the nonlinearity relaxation spring through the torsion bar at one end portion and an electrode support member extending from the lever, and
wherein the second comb electrode is provided to the electrode support member.

10. The optical device according to claim 1,
wherein the nonlinearity relaxation spring includes a meandering portion which extends in a meandering manner when viewed from the first direction.

* * * * *